(12) United States Patent
Mizokuchi et al.

(10) Patent No.: US 7,187,041 B2
(45) Date of Patent: Mar. 6, 2007

(54) VERTICAL GATE SEMICONDUCTOR DEVICE AND METHOD FOR FABRICATING THE SAME

(75) Inventors: Shuji Mizokuchi, Kyoto (JP); Mitsuhiro Yamanaka, Yawata (JP); Hiroyuki Gunji, Utsunomiya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 2 days.

(21) Appl. No.: 10/962,573

(22) Filed: Oct. 13, 2004

(65) Prior Publication Data
US 2005/0133861 A1 Jun. 23, 2005

Related U.S. Application Data

(63) Continuation of application No. PCT/JP04/08363, filed on Jun. 8, 2004, now abandoned.

(30) Foreign Application Priority Data
Dec. 22, 2003 (JP) .............................. 2003-425128

(51) Int. Cl.
H01L 29/78 (2006.01)
H01L 21/336 (2006.01)
(52) U.S. Cl. ................ 257/401; 257/329; 257/E29.262
(58) Field of Classification Search ................ 257/329, 257/401; 438/270
See application file for complete search history.

(56) References Cited

U.S. PATENT DOCUMENTS

| 4,767,722 A | 8/1988 | Blanchard |
| 5,034,785 A | 7/1991 | Blanchard |
| 5,883,411 A | 3/1999 | Ueda et al. |
| 6,351,009 B1 | 2/2002 | Kocon et al. |
| 6,445,037 B1 | 9/2002 | Hshieh et al. |

FOREIGN PATENT DOCUMENTS

| JP | 2662217 | 6/1997 |
| JP | 11-68107 | 3/1999 |
| JP | 11-103052 | 4/1999 |
| JP | 2000-252468 | 9/2000 |
| JP | 2001-085685 | 3/2001 |
| JP | 2001-94101 | 4/2001 |
| JP | 2001-168333 | 6/2001 |
| JP | 2002-110978 | 4/2002 |
| JP | 2003-17699 | 1/2003 |
| JP | 2003-303967 | 10/2003 |

Primary Examiner—Evan Pert
(74) Attorney, Agent, or Firm—McDermott Will & Emery LLP

(57) ABSTRACT

A first region 11 functioning as a transistor includes a drain region 111, a body region 112 formed over the drain region 111, a source region 113A formed over the body region 112 and a trench formed through the body region 112 and having a gate electrode 120 buried therein. A source region 113B is formed over the body region 112 extending in a second region 12.

37 Claims, 14 Drawing Sheets

FIG. 3
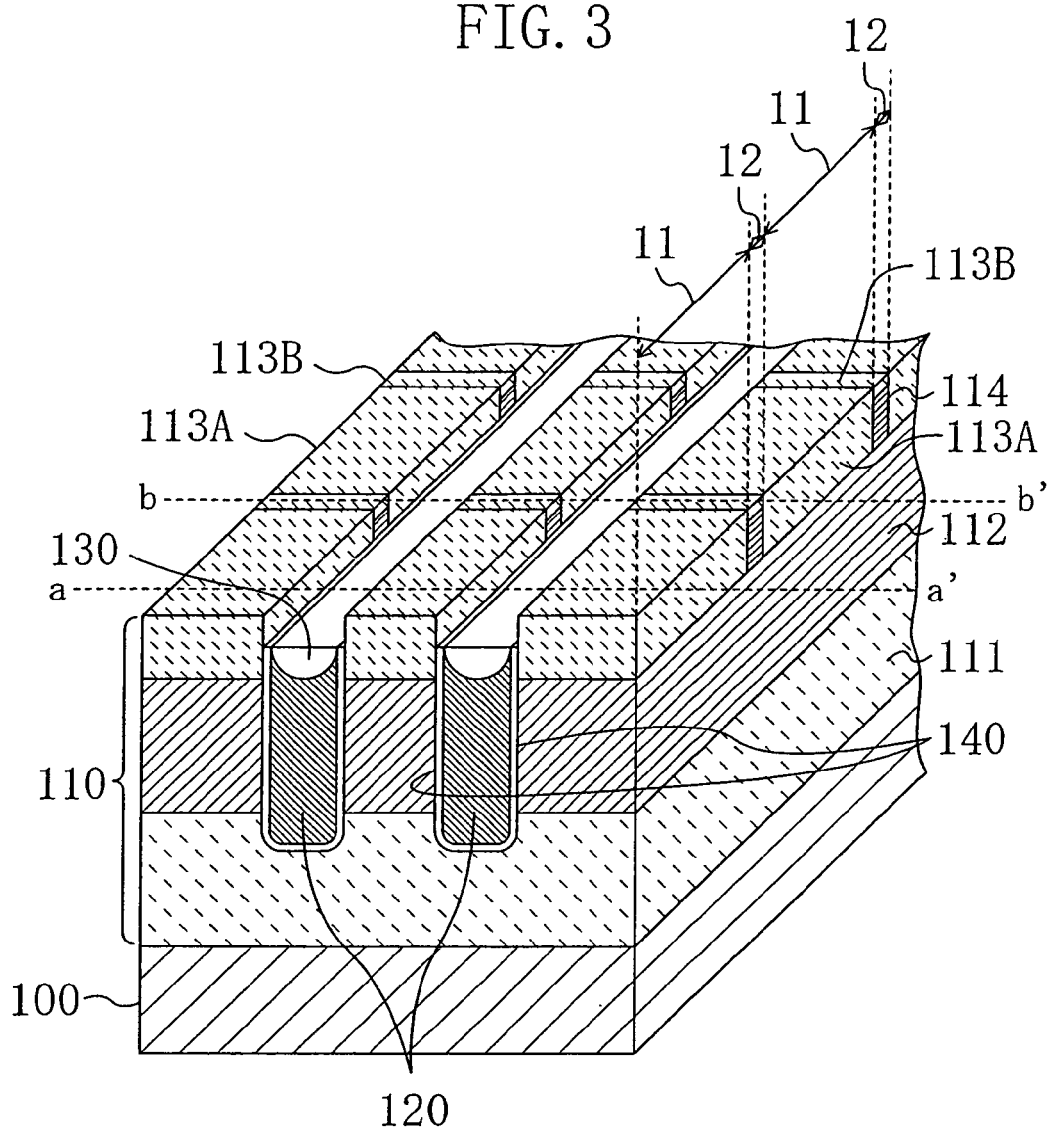
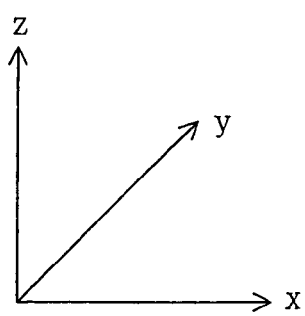

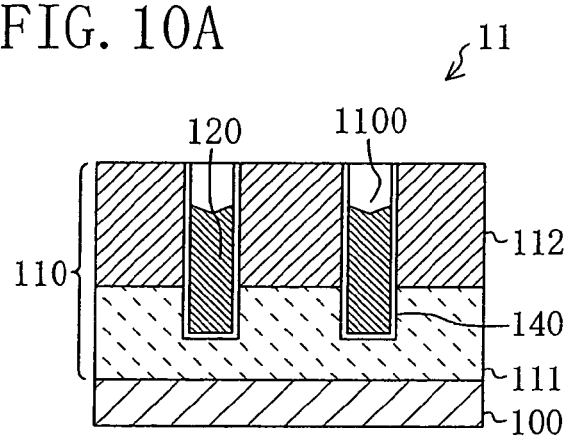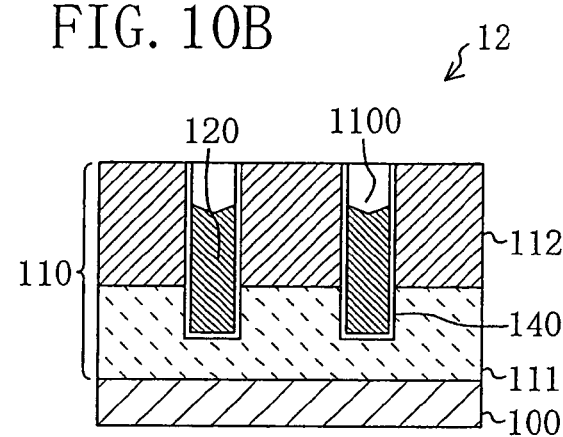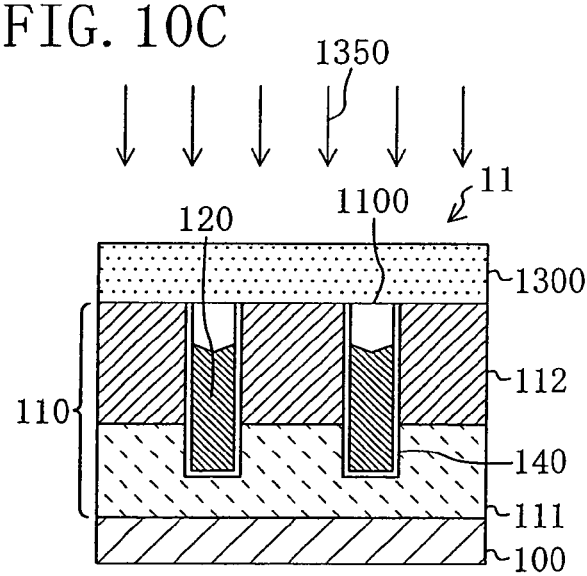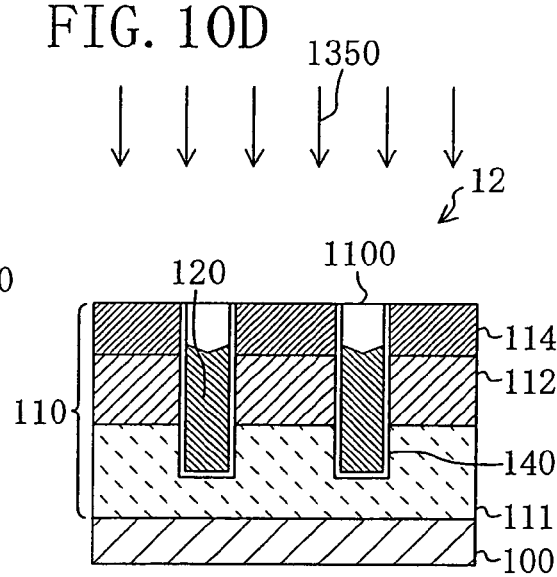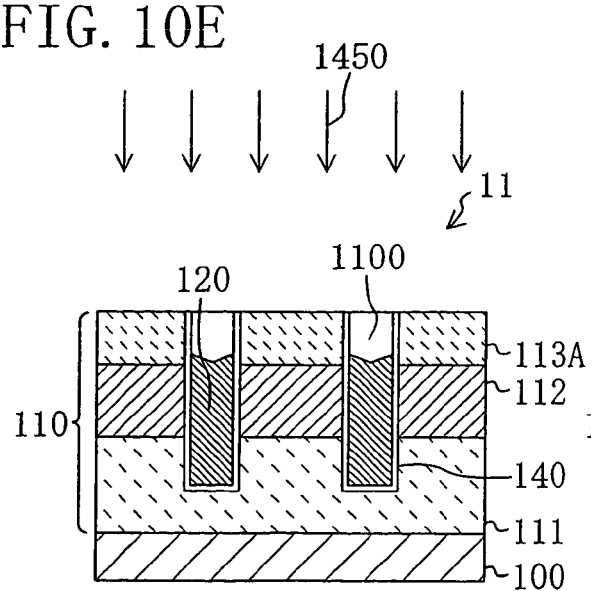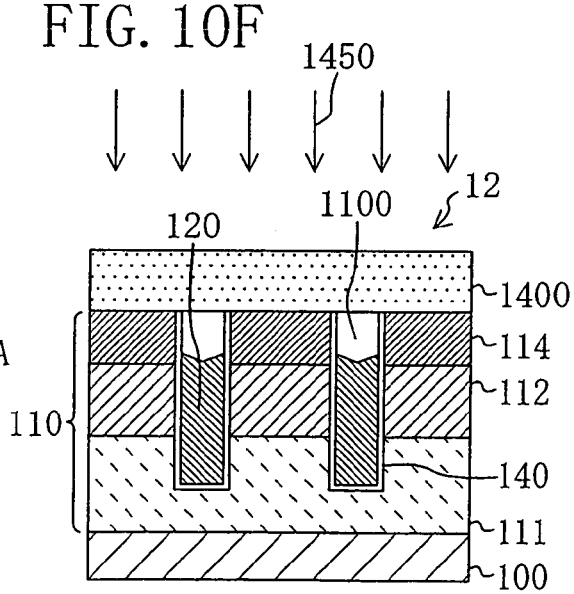

VERTICAL GATE SEMICONDUCTOR DEVICE AND METHOD FOR FABRICATING THE SAME

This is a continuation of Application PCT/JP2004/008363, filed Jun. 8, 2004, now abandoned.

FIELD OF THE INVENTION

The present invention relates to semiconductor devices having vertical gate electrodes and methods for fabricating the same.

BACKGROUND ART

In association with lowering in power consumption and increase in functionality and in speed of electronics equipment, lower power consumption or higher speed operation is demanded in semiconductor devices accompanied by such equipment. In order to satisfy such demands, low ON resistance of transistors is required in semiconductor devices generally used in DC-DC converters of electronics equipment. As one method for reducing the ON resistance of transistors, the density of the transistors arranged per unit area may be increased.

Specifically, a method has been proposed in which a gate electrode of a semiconductor device is arranged vertically (along a direction perpendicular to the principal plane of the substrate). As a semiconductor device employing this method, there is vertical gate semiconductor device. In the vertical semiconductor device, the gate electrode is vertically arranged and the source region is formed so as to face the upper part of the gate electrode. Also, the drain region is formed so as to face the bottom part of the gate electrode.

In the vertical gate semiconductor device, of which gate electrode is arranged vertically, the uppermost face of the vertical gate electrode and the surface of the silicon region where the source region is formed is almost on a level. Therefore, in order to prevent conduction between the vertical gate electrode and the source region or the body contact region, it is necessary to cover the upper part of the vertical gate electrode with, for example, a convex insulating film when the source region and the body contact region are connected to the common electrode.

As a prior art for solving this problem, there has been proposed a technique disclosed in Japanese Patent Application Laid Open Publication No. 2000-252468A. In this reference, the above problem is solved in such a manner that in a plurality of vertical gate semiconductor devices arranged in parallel with each other, the uppermost face of each gate electrode is concaved from the level of the surface of the silicon region where the source region is formed and an insulating film is filled in the concave part above the vertical gate electrode.

A conventional vertical gate semiconductor device disclosed in Japanese Patent Publication No. 2662217B or Japanese Patent Application Laid Open Publication No. 2000-252468A will be described below with reference to drawings.

FIG. 1A is a view showing a structure in section of a conventional vertical gate semiconductor device, specifically, a N-channel vertical gate DMOS (Double Diffused Metal Oxide Semiconductor) transistor.

As shown in FIG. 1A, an epitaxial layer 1810 is formed on a silicon substrate 1800, which is a $N^+$-type semiconductor substrate with N-type (first conductivity type) impurity doped, by an epitaxial growth method. The epitaxial layer 1810 includes a N-type drain region 1811, a P-type body region 1812 formed on the drain region 1811, a $N^+$-type source region 1813 formed on the body region 1812, and a $P^+$-type body contact region 1814 which is formed adjacent to the source region 1813 and has an impurity concentration higher than that of the body region 1812. In the epitaxial layer 1810, a trench passing through the source region 1813 and the body region 1812 and extending to the upper part of the drain region 1811 is formed and a vertical gate electrode 1820 is buried in the trench. The level of the uppermost face of the vertical gate electrode 1820 is lower than the level of the surface of the epitaxial layer 1810 where the source region 1813 is formed. An insulating film 1830 is filled over the vertical gate electrode 1820 in the trench. Further, an insulating material 1840 serving as a gate insulating film intervenes between the vertical gate electrode 1820 and the respective faces of the drain region 1811 and the body region 1812 each serving as a vertical face of the trench. In addition, a common electrode 1850 to which the source region 1813 and the body contact region 1814 are commonly connected is formed on the epitaxial layer 1810.

FIG. 1B is a plan view showing a MOSFETs array in which cells are arranged in arrays, with the use of the MOSFET shown in FIG. 1A as one cell (one unit). Wherein, FIG. 1A is a section taken along a line A–A' of FIG. 1B. In addition, the members other than the vertical gate electrode 1820, the source region 1813 and the body contact region 1814 are not shown in FIG. 1B.

As described above, the epitaxial layer (semiconductor layer) 1810 of the conventional vertical gate semiconductor device shown in FIGS. 1A and 1B includes the N-type drain region 1811, the P-type body region 1812 formed on the drain region 1811, and the $N^+$-type source region 1813 and the $P^+$-type body contact region 1814 which are formed on the body region 1812 so as to be adjacent with each other. Each surface of the source region 1813 and the body contact region 1814 serves as the surface of the semiconductor layer 1810. Further, the upper part of the vertical gate electrode 1820 faces the source region 1813 and the bottom part of the vertical gate electrode 1820 faces the drain region 1811.

In a vertical gate semiconductor device having the above construction, the insulating film 1830 prevents conduction between the vertical gate electrode 1820 and the source region 1813 or the body contact region 1814. Accordingly, a step of covering the upper face of the vertical gate electrode 1820 with an insulating film, which has been performed when the source region 1813 and the body contact region 1814 are connected in common to the common electrode, can be omitted.

Moreover, since the uppermost face of the insulating film 1830 and the surface of the silicon region (semiconductor layer 1810) where the source region 1813 is formed are on a level, the subsequent masking step can be performed on a plane surface, thereby facilitating the fabrication of the vertical gate semiconductor device.

FIGS. 2A and 2B are sections each showing a construction of another conventional vertical gate semiconductor device, specifically, a N-channel vertical gate DMOS transistor disclosed in Japanese Patent Application Laid Open Publication No. 2000-252468A. Wherein, FIG. 2A is a section showing a first region functioning as a MOS transistor and FIG. 2B is a section showing a second region for electrical contact with the body region of the transistor.

As shown in FIG. 2A, in the first region, a N-type drain region 2811 is formed on a silicon substrate 2800, which is a $N^+$-type semiconductor substrate with a N-type (first conductivity type) impurity doped. A P-type body region 2812 is formed on the drain region 2811 and a N+-type source region 2813 is formed on the body region 2812. Through the source region 2813 and the body region 2812, a trench extending to the upper part of the drain region 2811 is formed and a vertical gate electrode 2820 is buried in the trench. The level of the uppermost face of the vertical gate electrode 2820 is lower than that of the surface of the semiconductor layer where the source region 2813 is formed. An insulating film 2830 is filled over the upper part of the vertical gate electrode 2820 in the trench. Also, an insulating material 2840 serving as a gate insulating film intervenes between the vertical gate electrode 2820 and the respective faces of the drain region 2811 and the body region 2812 each serving as a vertical wall face of the trench. In addition, a common electrode 2850 to be connected to the source region 2813 is formed on the source region 2813.

On the other hand, as shown in FIG. 2B, the second region has the same sectional construction as in the first region, except that a P+-type body contact region 2814 is formed in lieu to the source region 2813 shown in FIG. 2A.

FIG. 2C is a plan view showing the MOSFETs array in which the first region shown in FIG. 2A and the second region shown in FIG. 2B are alternately arranged in stripes along a direction along which the vertical gate electrode 2820, namely, the gate trench extends. Wherein, the members other than the vertical gate electrode 2820, the source region 2813 and the body contact region 2814 are not shown in FIG. 2C.

As shown in FIG. 2C, the source region 2813 and the body contact region 2814 are alternately arranged along the respective gate electrodes 2820 (i.e., gate trenches), so that the plural arrays in stripes is formed. The respective arrays are arranged adjacent to the respective gate trenches and are separated from one another by the respective gate trenches. Further, referring to the vertical dimension (dimension along which the gate trenches extend) in the arrays arranged beside the gate trenches, the source region 2813 has a relatively long dimension and the body contact region 2814 has a relatively short dimension, as shown in FIG. 2C. In other words, the first region functioning as a transistor has a larger area than that of the second region functioning as a body contact.

With the latter conventional vertical gate semiconductor device having the striped layout shown in FIG. 2A through FIG. 2C, the intervals between the gate trenches can be set narrower than that in the conventional MOSFETs array having the cellular layout shown in FIGS. 1A and 1B.

In order to ensure the contact area between the source region and the electrode (common electrode) in such conventional MOSFETs array in the cellular layout, for example, Japanese Patent Application Laid Open Publication No. 2001-085685A or Japanese Patent Application Laid Open Publication No. 11-103052A discloses a technique of forming an insulating film over the gate electrode in the gate trench so that the level of the uppermost face of the insulating film is lower than the level of the surface of the semiconductor layer where the source region is formed. In this technique, the source region and the common electrode can be in contact partially with each other in the respective parts of the gate trench wall face and the surface of the semiconductor layer.

However, in such a conventional vertical gate semiconductor device having the aforementioned cellular layout, the contact resistance of the source region is increased in association with size reduction of the device for miniaturization. In detail, if a distance between the adjacent trench gate electrodes is narrowed in association with the size reduction of the vertical gate semiconductor device, the source region is also narrowed accordingly. For example, in a vertical gate semiconductor device in which vertical gates each having a width of 0.25 μm are arranged at intervals of 0.25 μm, if the intervals between the vertical gate electrodes are shortened 0.1 μm, the width of the vertical gate electrodes cannot be shortened when taking account of the resistance of polysilicon. Therefore, the intervals between the vertical gate electrodes must be narrowed to 0.15 μm necessarily, with a result of extremely small source region formed therebetween. Hence, the contact area between the common electrode and the source region becomes small, resulting in increased contact resistance of the source region.

It is noted that a smaller contact area between the common electrode and the body contact region increases the contact area between the common electrode and the source region because the layout area where the body contact region is arranged and the layout area where the source region is arranged are in a relationship of trade-off. However, such a smaller contact area between the common electrode and the body contact region leads to insufficient grounding of the body region and invites a parasite bipolar transistor to operate.

On the other hand, in a conventional vertical gate semiconductor device having the aforementioned striped layout, the intervals between adjacent trench gate electrodes are narrowed in association with size reduction of the device for miniaturization, and the source region is narrowed accordingly. In its turn, the contact area between the common electrode and the source region becomes small, resulting in increased contact resistance of the source region.

SUMMARY OF THE INVENTION

The present invention has been made in view of the above problems and has its object of providing a vertical gate semiconductor device that can be compacted without increasing the contact resistance of the source region and a fabricating method for it.

In order to attain the above object, a first vertical gate semiconductor device according to the present invention includes: a first region functioning as a transistor; and a second region for electrical contact with a body region of the transistor, the first region and the second region being arranged adjacent to each other, wherein the first region includes: a drain region; the body region formed over the drain region; a first source region formed over the body region; and a trench which is formed through the sourced region and the body region and in which a gate electrode is buried, and the body region extends to the second region, and a second source region electrically connected to the first source region is formed over the body region of the second region.

In the first gate semiconductor device, the source region is formed over the body region in the second region for electrical contact with the body region. Therefore, even if the distance between the gate electrodes is shortened in association with size reduction of the device, the contact area between the common electrode and the source region is sufficiently ensured with no reduction of the layout area of the body contact region. Hence, size reduction of the vertical gate semiconductor device is realized with no increase in contact resistance of the source region.

In the first vertical gate semiconductor device, it is preferable to set a thickness of the second source region smaller than a thickness of the first source region.

By this setting, the respective electrical contact with the source region and the body region is ensured through the wall face of the trench in the second region even if the depth of the gate trench formed in the second region is the same as the depth of the gate trench formed in the first region.

In the first vertical gate semiconductor device, it is preferable that the second source region covers an entirety of the body region of the second region.

With this arrangement, formation of the gate electrode so as to form the recessed part in the upper part of the trench leads to electrical contact with the source region through the wall face of the recessed part in both the first region and the second region.

In the first vertical gate semiconductor device, it is preferable that an impurity concentration of a part in a vicinity of the second source region of the body region of the second region is higher than an impurity concentration of other part of the body region of the second region.

In so doing, the electrical contact with the body region is further ensured.

In the first vertical gate semiconductor device, it is preferable that: the trench is formed also through the second source region and the body region of the second region; and the body region of the second region is exposed at a wall face of the recessed part and is in electrical contact through the exposed part.

With this arrangement, in addition to the electrical contact with the source region in each of the first region and the second region, the body region is in electrical contact in common to the source region in the second region, and therefore, the intervals between the trench gate electrodes can be narrowed, thereby promoting the size reduction of the device.

In the first vertical gate semiconductor device, it is preferable that: the trench is formed also through the second source region and the body region of the second region; the gate electrode is formed so as to form a recessed part in an upper part of each trench; and the first source region and the second source region are exposed at respective wall faces of the recessed part and are in electrical contact through the respective exposed parts and respective upper faces of the respective source regions.

With this arrangement, the contact area between the common electrode and the source region is increased, with a result of further reduction of the contact resistance of the source region.

In the case where the body region of the second region is exposed at the wall face of the recessed part in the upper part of the gate trench and the electrical contact is allowed through the exposed part, the body region of the second region may include, in an upper portion thereof, a heavily doped region of which impurity concentration is relatively high so that the heavily doped region may be exposed at the wall face of the recessed part and is in electrical contact through the exposed part. Or, the second source region and the body region of the second region may be exposed at the wall face of the recessed part so as to be in electrical contact through the respective exposed parts. Or, it is possible that an additional electrode is formed on the gate electrode in the recessed part with an insulating layer interposed and the additional electrode is in contact with the second source region and the body region of the second region at the wall face of the recessed part.

A second vertical gate semiconductor device according to the present invention is a vertical trench gate semiconductor device including a first region functioning as a transistor; and a second region for electrical contact with a body region of the transistor, the first region and the second region being arranged adjacent to each other, wherein the first region includes: a drain region; the body region formed over the drain region; a first source region formed over the body region; and a trench which is formed through the first source region and the body region and in which a gate electrode is buried, the body region and the trench formed therethrough extend to the second region, the gate electrode is formed so as to form a recessed part in an upper part of the trench, and the body region of the second region is exposed at a wall face of the recessed part and is in electrical contact through the exposed part.

In the second vertical gate semiconductor device, the body region of the second region can be in electrical contact through the wall face of the recessed part above the gate in the trench, and therefore, the contact area between the common electrode and the body region can be ensured. Accordingly, a voltage difference is prevented from being caused in the body region in the operation of the transistor, with a result that a parasite bipolar transistor is prevented from operating.

In the second vertical gate semiconductor device, it is preferable that: a second source region electrically connected to the first source region is formed over the body region of the second region; an additional electrode is formed on the gate electrode in the recessed part with an insulating layer interposed; and the additional electrode is in contact with the second source region and the body region of the second region at the wall face of the recessed part.

With this arrangement, the source region and the body region are surely connected in common to the electrode at the wall face of the gate trench of the second region. In detail, in addition to the electrical contact with the source region in both the first region and the second region, the body region of the second region is in electrical contact in common to the source region, and therefore, the intervals between the trench gate electrodes can be shortened, thereby further promoting the size reduction of the device. Further, in this case, if the additional electrode is in contact with respective upper faces of the first source region and the second source region, electrical contact with the source region is allowed also through the upper face of the source region in each of the first region and the second region.

In the second vertical gate semiconductor device, it is preferable to form a source region, which is electrically connected to the first source region and is thinner than the source region of the first region, over the body region of the second region.

With this arrangement, even if the depth of the gate trench formed in the second region is the same as the depth of the gate trench formed in the first region, the source region and the body region are in electrical contact surely through the wall face of the trench in the second region.

In the second vertical gate semiconductor device, it is preferable that: the body region of the second region includes, in an upper portion thereof, a heavily doped region having a relatively high impurity concentration; and the heavily doped region is exposed at the wall face of the recessed part and is in electrical contact through the exposed part.

With this arrangement, the electrical contact with the body region is further ensured. Further, in this case, an additional electrode may be formed on the gate electrode in the recessed part with an insulating layer interposed so that the additional electrode is in contact with the heavily doped region at the wall face of the recessed part.

A first vertical gate semiconductor device fabricating method according to the present invention is a method for fabricating a vertical trench gate semiconductor device in which a first region functioning as a transistor and a second region for electrical contact with a body region of the transistor are arranged adjacent to each other, and the method includes the steps of a first step of forming a drain region in a semiconductor region to be the first region and the second region and forming a body region over the drain region of the semiconductor region; a second step of forming a trench in the body region of the first region; a third step of forming a first source region over the body region of the first region in the semiconductor region; and a fourth step of forming a second source region over the body region of the second region in the semiconductor region, wherein the first source region and the second source region are formed so as to be electrically connected to each other.

According to the first vertical gate semiconductor deice fabricating method, the source region is formed over the body region in the second region for electrical contact with the body region. Therefore, even if the intervals between the gate electrodes are shortened in association with size reduction of the device, the contact area between the common electrode and the source region is sufficiently ensured with no reduction of the layout area of the body contact region. Hence, the size reduction of the vertical gate semiconductor device is realized with no increase in contact resistance of the source region.

Further, according to the first vertical gate semiconductor device fabricating method, the formation of each source region (the third and fourth steps) is performed after the formation of the trench (the second step), with a result that the thermal treatment after the formation of the source region can be moderated. Hence, the impurity diffusion in the source region can be controlled, with a result that the device dimension can be precisely performed.

In the first vertical gate semiconductor device fabricating method, it is preferable that the fourth step includes introducing simultaneously an impurity to parts respectively to be the first source region and the second source region in the semiconductor region.

By this inclusion, impurity implantation to the semiconductor region can be performed in forming the second source region as ion implantation to, for example, the entirety of the semiconductor region, and therefore, the second source region can be formed with no additional lithography step necessitated.

In the first vertical gate semiconductor device fabricating method, it is preferable to form the second source region so as to cover an entirety of the body region of the second region.

By this formation, formation of the gate electrode so as to form a recessed part in the upper part of the trench leads to electrical contact with the source region through the wall face of recessed part in each of the first region and the second region.

In the first vertical gate semiconductor device fabricating method, it is preferable to further include the step of forming a heavily doped region, of which impurity concentration is relatively high, in an upper portion of the body region of the second region.

By this inclusion, the electrical contact with the body region is further ensured.

In the first vertical gate semiconductor device fabricating method, it is preferable that: the second step includes forming the trench also through the body region of the second region; and the method further includes, after the second step, the steps of forming a gate electrode in the trench so as to form a recessed part in an upper part of the trench and so as to expose the body region of the second region at a wall face of the recessed part; and forming, in the recessed part, an additional electrode electrically connected with the body region of the second region.

By this inclusion, in addition to the electrical contact with the source region in each of the first region and the second region, the body region of the second region is in electrical contact in common to the source region, and therefore, the intervals between the trench gate electrodes can be narrowed, thereby promoting the size reduction of the device.

In the first vertical gate semiconductor device fabricating method, it is preferable that: the second step includes forming the trench also in the body region of the second region; and the method further includes, after the second step and the fourth step, the steps of forming a gate electrode in the trench so as to form a recessed part in an upper part of each trench and so as to expose the second source region at a wall face of the recessed part; and forming, in the recessed part, an additional electrode electrically connected with the second source region.

By this inclusion, the contact area between the common electrode (the additional electrode) and the source region is increased, thereby further reducing the contact resistance of the source region.

In the first vertical gate semiconductor device fabricating method, it is preferable that: the second step includes forming the trench also through the body region of the second region; and the method further includes, after the second step and the fourth step, the steps of: forming a gate electrode in the trench so as to form a recessed part in an upper part of the trench and so as to expose the body region and the second source region of the second region at a wall face of the recessed part; and forming, in the recessed part, an additional electrode electrically connected with the body region of the second region and the second source region.

By this inclusion, in addition to the electrical contact with the source region in each of the first region and the second region, the body region is in electrical contact in common to the source region in the second region, and therefore, the intervals between the trench gate electrodes can be narrowed, thereby further promoting the size reduction of the device. Further, the contact area between the common electrode (the additional electrode) and the source region is increased, thereby further reducing the contact resistance of the source region.

A second vertical gate semiconductor device fabricating method according to the present invention is a method for fabricating a vertical trench gate semiconductor device in which a first region functioning as a transistor and a second region for electrical contact with a body region of the transistor are arranged adjacent to each other, comprising the steps of: forming a drain region in a semiconductor region to be the first region and the second region and forming a body region over the drain region in the semiconductor region; forming a trench in each the body region of the first region and the second region; forming a gate electrode in the trench so as to form a recessed part in an upper part of the trench and so as to expose the body region of the second region at a wall face of the recessed part; and forming, in the recessed part, an additional electrode electrically connected with the body region of the second region.

In the second vertical gate semiconductor device fabricating method, the body region of the second region can be in electrical contact through the wall face of the recessed part above the gate in the trench, and therefore, the contact area between the common electrode (the additional electrode) and the body region can be ensured. Accordingly, a voltage difference is prevented from being caused in the body region in the operation of the transistor, with a result that a parasite bipolar transistor is prevented from operating.

In the second vertical gate semiconductor device fabricating method, it is preferable to further include the step of forming a heavily doped region having a relatively high impurity concentration in an upper portion of the body region of the second region.

By this inclusion, the electrical contact with the body region is further ensured. It is noted that the heavily doped region in the body region of the second region is exposed at the wall face of the recessed part above the gate in this case.

As described above, in the present invention, size reduction of a vertical gate semiconductor device is realized with no increase in contact resistance of the source region.

BRIEF DESCRIPTION OF THE DRAWINGS

The accompanying drawings, which are incorporated in and form part of the specification, together with the description serve to explain the principles of the invention. In the drawings:

FIG. 3 is a bird's eye view of a vertical gate semiconductor device according to a first embodiment of the present invention.

FIG. 7A through FIG. 7F are sections respectively showing steps of a vertical gate semiconductor device fabricating method according to the first embodiment of the present invention, wherein FIGS. 7A, 7C and 7E show states in which the first region functioning as a transistor is formed and FIGS. 7B, 7D and 7F show states in which the second region for electrical contact with the body region of the transistor is formed.

FIG. 8A through FIG. 8F are sections respectively showing steps of the vertical gate semiconductor device fabricating method according to the first embodiment of the present invention, wherein FIGS. 8A, 8C and 8E show states in which the first region functioning as a transistor is formed and FIGS. 8B, 8D and 8F show states in which the second region for electrical contact with the body region of the transistor is formed.

FIG. 9A through FIG. 9F are sections respectively showing steps of the vertical gate semiconductor device fabricating method according to the first embodiment of the present invention, wherein FIGS. 9A, 9C and 9E show states in which the first region functioning as a transistor is formed and FIGS. 9B, 9D and 9F show states in which the second region for electrical contact with the body region of the transistor is formed.

FIG. 10A through FIG. 10F are sections respectively showing steps of the vertical gate semiconductor device fabricating method according to the first embodiment of the present invention, wherein FIGS. 10A, 10C and 10E show states in which the first region functioning as a transistor is formed and FIGS. 10B, 10D and 10F show states in which the second region for electrical contact with the body region of the transistor is formed.

FIG. 11A through FIG. 11F are sections respectively showing steps of the vertical gate semiconductor device fabricating method according to the first embodiment of the present invention, wherein FIGS. 11A, 11C and 11E show states in which the first region functioning as a transistor is formed and FIGS. 11B, 11D and 11F show states in which the second region for electrical contact with the body region of the transistor is formed.

FIG. 12A through FIG. 12F are sections respectively showing steps of a vertical gate semiconductor device fabricating method according to a second embodiment of the present invention, wherein FIGS. 12A, 12C and 12E show states in which the first region functioning as a transistor is formed and FIGS. 12B, 12D and 12F show states in which the second region for electrical contact with the body region of the transistor is formed.

FIGS. 13A and 13B are sections respectively showing steps of the vertical gate semiconductor device fabricating method according to the second embodiment of the present invention, wherein FIG. 13A shows states in which the first region functioning as a transistor is formed and FIG. 13B shows states in which the second region for electrical contact with the body region of the transistor is formed.

DETAILED DESCRIPTION

First Embodiment

Figure 1A:
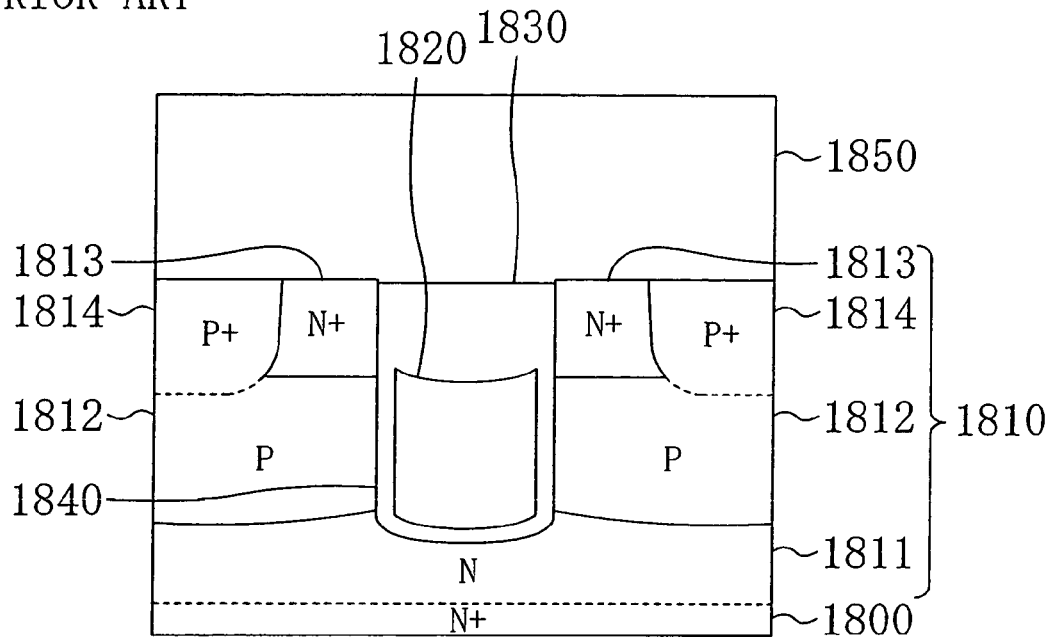
FIG. 1A and FIG. 1B are respectively a section and a plan view of a conventional vertical gate semiconductor device.
Figure 1B:
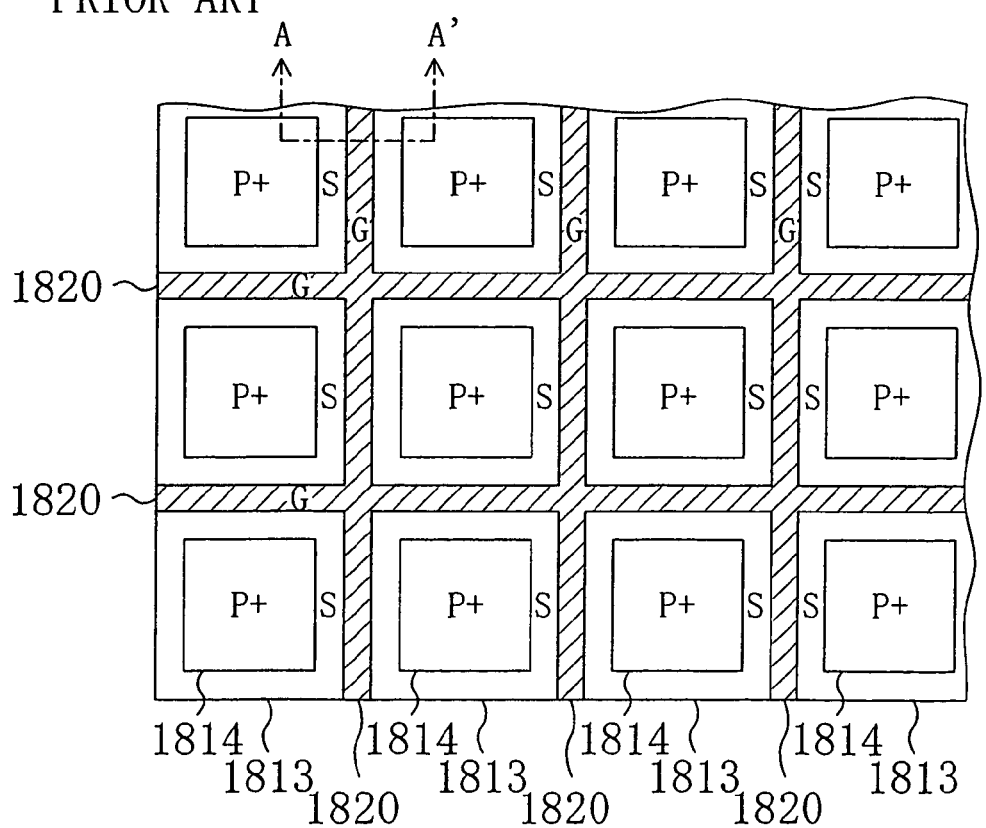
Figure 2A:
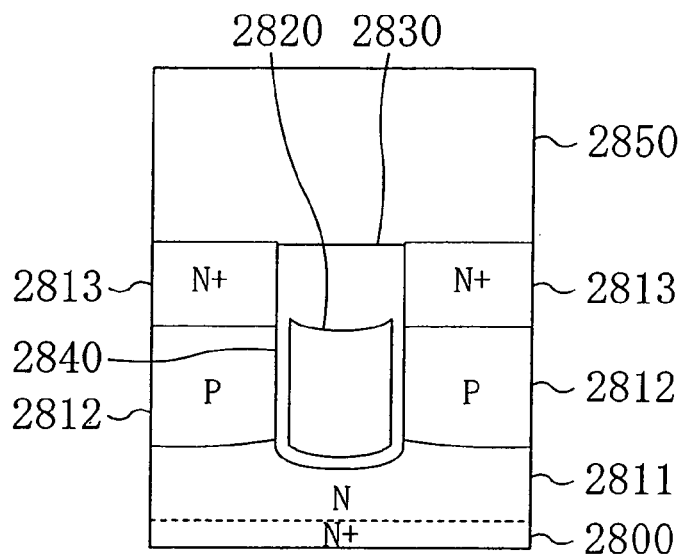
FIG. 2A and FIG. 2B are sections of another conventional vertical gate semiconductor device and FIG. 2C is a plan view of this vertical gate semiconductor device.
Figure 2B:
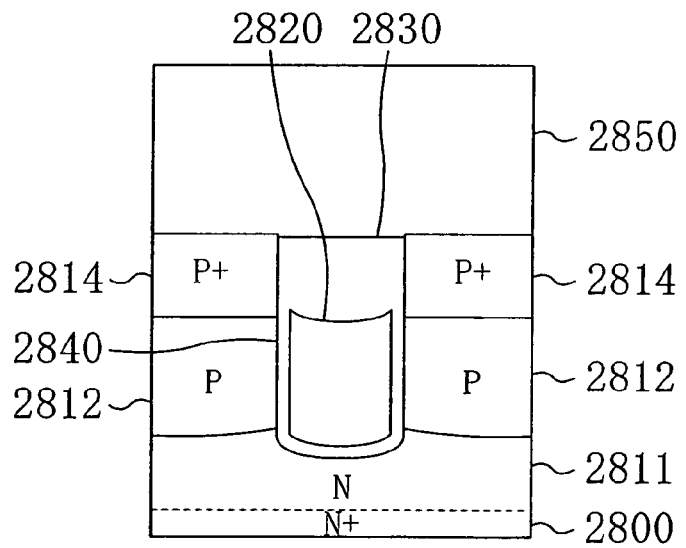
Figure 2C:
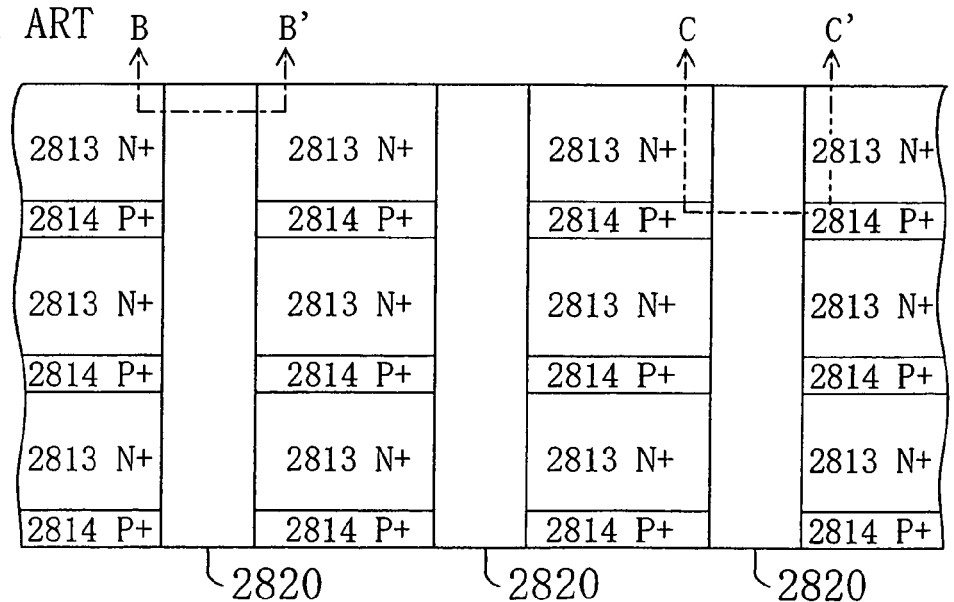

A vertical gate semiconductor device according to the first embodiment of the present invention will be described below with reference to accompanying drawing. It is noted that the vertical gate semiconductor device in the present embodiment is intended to compact the device without increase in contact resistance of the source region invited.

FIG. 3 is a bird's eye view (3-dimentional view) of the vertical gate semiconductor device of the present embodiment. As shown in FIG. 3, in the vertical gate semiconductor device of the present embodiment, a semiconductor layer 110 is formed on a $N^+$-type silicon substrate 100 serving as a first conductivity type semiconductor substrate by for example, an epitaxial growth method. A plurality of trenches extending in stripes in the aforementioned semiconductor layer 110 are formed and a vertical gate electrode 120 is buried in each of the trenches. Also, a buried insulating film 130 is formed on the vertical gate electrode 120 in each trench. Wherein, the level of the uppermost face of the buried insulating film 130 is lower than the level of the surface of the semiconductor layer 110. An insulating material 140 serving as a gate insulating film intervenes between the vertical gate electrode 120 (specifically, the side face and the bottom face thereof) and the semiconductor layer 110. It is noted that the width of each trench in which the vertical gate electrode 120 is buried is set to about 0.25 μm and the intervals between the respective trenches are set to about 0.25 μm in the present embodiment. Further, the depth of each trench is set to 1.25 μm. Accordingly, the aspect ratio of each trench is about 5. Herein, the depth of each trench is a distance from the surface of a source region 113 described later to the bottom of the trench. Further, in the present embodiment, the number of the trenches is about 1500. In detail, about 1500 trenches are arranged in parallel and extend continuously across a first region 11 and a second region 12 (see FIG. 4C.). A common electrode (metal wiring) 170 having a laminated structure of a barrier metal film 160 and an aluminum film 150 is formed, through not shown, on the semiconductor layer 110 including a recessed part above the buried insulating film 130 in each trench (see FIG. 4A and FIG. 4B).

As shown in FIG. 3, the semiconductor layer 110 periodically changes in a longitudinal direction (y direction in FIG. 3) of the trenches arrange in stripes which intersects at a right angle with a width direction (x direction in FIG. 3) of the trenches. In detail, the semiconductor layer 110 includes the first region 11 functioning as a transistor and the second region 12 for electrical contact with the body region of the transistor which are arranged alternately in the longitudinal direction of the trenches, namely, in the y direction (see FIG. 4C.). In other words, the semiconductor layer 110 changes from the first region 11 to the second region 12 at a given point as a boundary in the y direction.

Figure 4A:
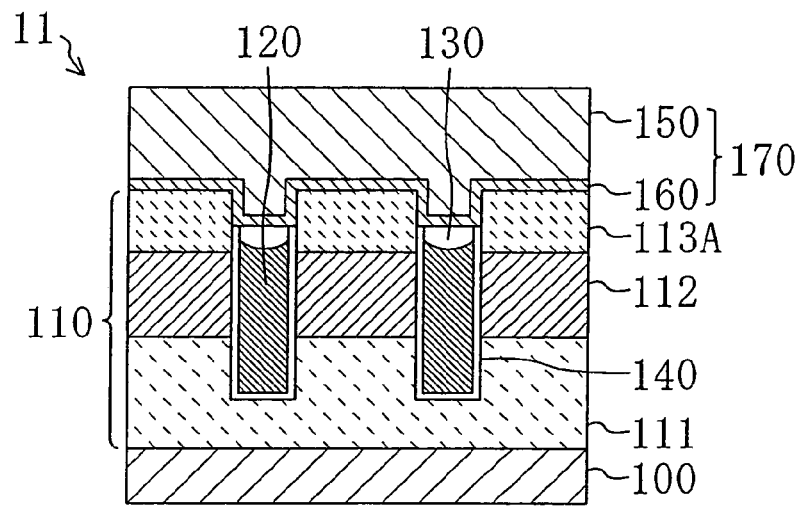
FIG. 4A is a section of a first region taken along a line a–a' of FIG. 3.
Figure 4B:
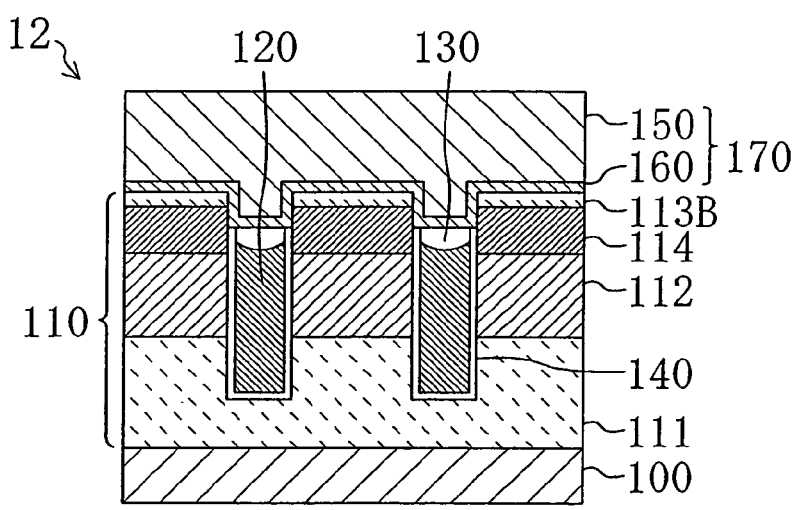
FIG. 4B is a section of a second region taken along a line b–b' of FIG. 3.
Figure 4C:
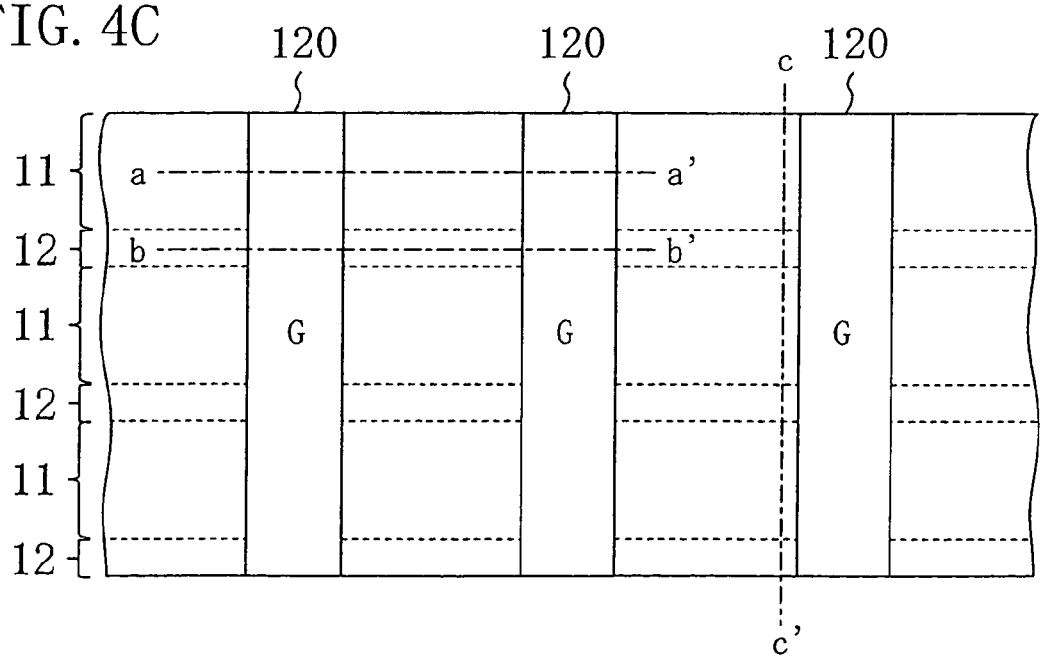
FIG. 4C is a plan view of the vertical gate semiconductor device according to the first embodiment of the present invention.
Figure 5:
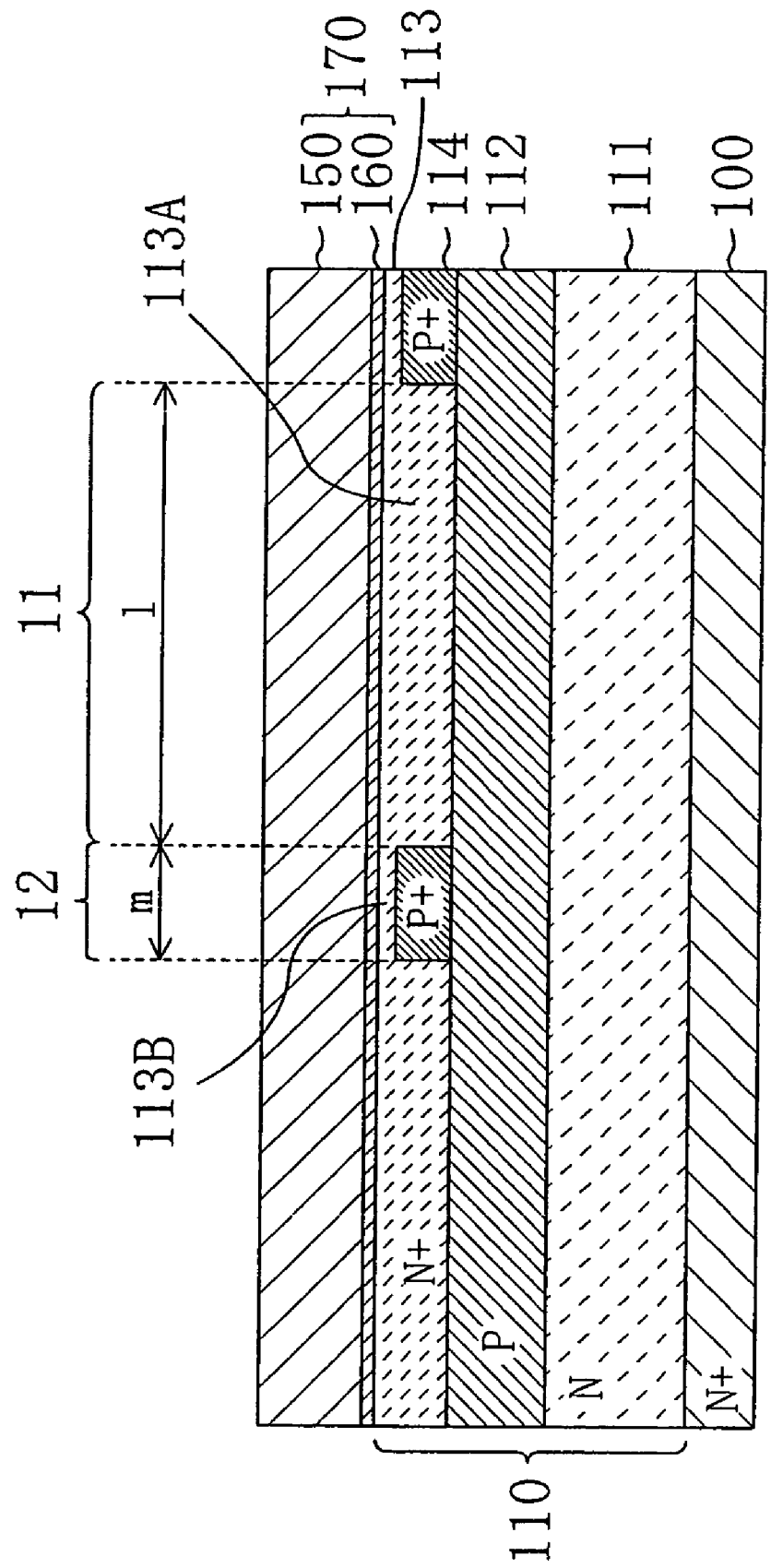
FIG. 5 is a section taken along a line c–c' of FIG. 4C.

FIG. 4A is a section of the first region 11 taken along a line a–a' of FIG. 3, and FIG. 4B is a section of the second region 12 taken along a line b–b' of FIG. 3. FIG. 4C is a schematic plan view showing the structure of the vertical gate semiconductor device of the present embodiment, and FIG. 5 is a section taken along a line c–c' of FIG. 4C. It is noted that FIG. 4A also serves as a section taken along a line a–a' of FIG. 4C and FIG. 4B also serves as a section taken along a line b–b' of FIG. 4C.

As shown in FIGS. 4A and 4B, in each of the first region 11 and the second region 12, the semiconductor layer 110 includes a drain region 111 of a first conductivity type (e.g., N-type) semiconductor layer, and a body region 112 of a second conductivity type (reverse polarity of the first conductivity type: e.g., P-type) semiconductor layer, which is formed on the drain region 111 and through which the gate trench passes. In other words, the drain region 111 and the body region 112 extend through the entirety of the semiconductor layer 110 including the first region 11 and the second region 12.

It is noted that in the vertical gate semiconductor device in the present embodiment, a ratio of layout areas between the first region 11 and the second region 12 is determined according to a value of an allowable current that allows a current to flow to the transistor of the vertical gate semiconductor device. Specifically, as shown in FIG. 5, the ratio l:m of the layout areas between the first region 11 and the second region 12 (ratio of the lengths in the y direction) is set to about 5:1 in the case where the device is composed of transistors that operate with a low current and is set to about 3:1 in the case where the device is composed of transistors that operate with a high current. Thus, in the case where the length of the gate trench is about 6 μm in the y direction and the device is composed of transistors that operate with a low current, the first region 11 has a length 1 of 5 μm in the y direction and the second region 12 has a length m of about 1 μm in the y direction.

Herein, as shown in FIG. 4A, the semiconductor layer 110 of the first region 11 includes a source region 113A, which is formed of a first conductivity type (e.g., N+-type) semiconductor layer, on the body region 112.

On the other hand, as one of the significant features of the present embodiment, as shown in FIG. 4B, the semiconductor layer 110 of the second region 12 includes, on the body region 112, a body contact region 114 of a second conductivity type (e.g., P+-type) and a source region 113B of the first conductivity type (e.g., N+-type). The source region 113B is formed so as to cover the entirety of the upper part of the body contact region 114 and is electrically connected with the source region 113A of the first region 11. The thickness of the source region 113B is less than that of the source region 113A. Further, the impurity concentration of the body contact region 114 is greater than that of the body region 112.

Namely, the semiconductor layer 110 of the first region 11 has a structure in which the source region 113A is formed on the body region 112 and the surface of the source region 113A serves as the principal plane of the semiconductor layer 110. On the other hand, the semiconductor layer 110 of the second region 12 has a structure in which the body contact region 114 is formed on the body region 112, the source region 113B is formed on the body contact region 114 and the surface of the source region 113B serves as the principal plane of the semiconductor layer 110.

Figure 6A:
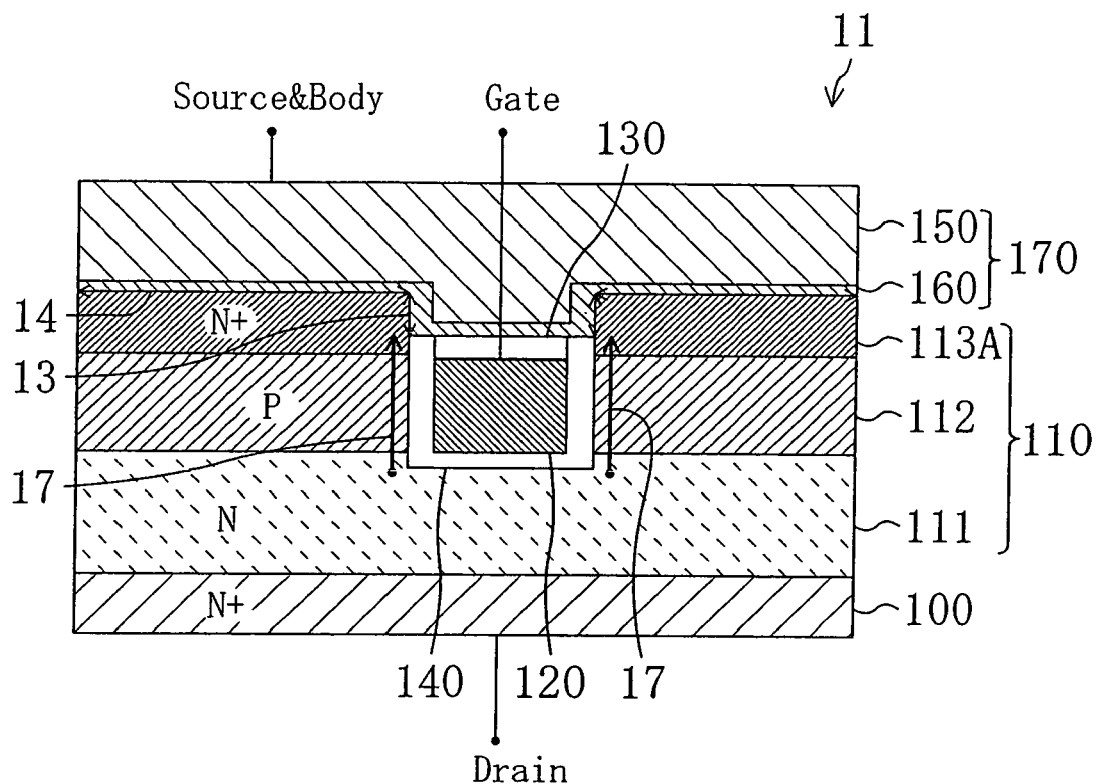
FIG. 6A is a diagram schematically showing a structure in section of a first region functioning as a transistor in the vertical gate semiconductor device according to the first embodiment of the present invention.
Figure 6B:
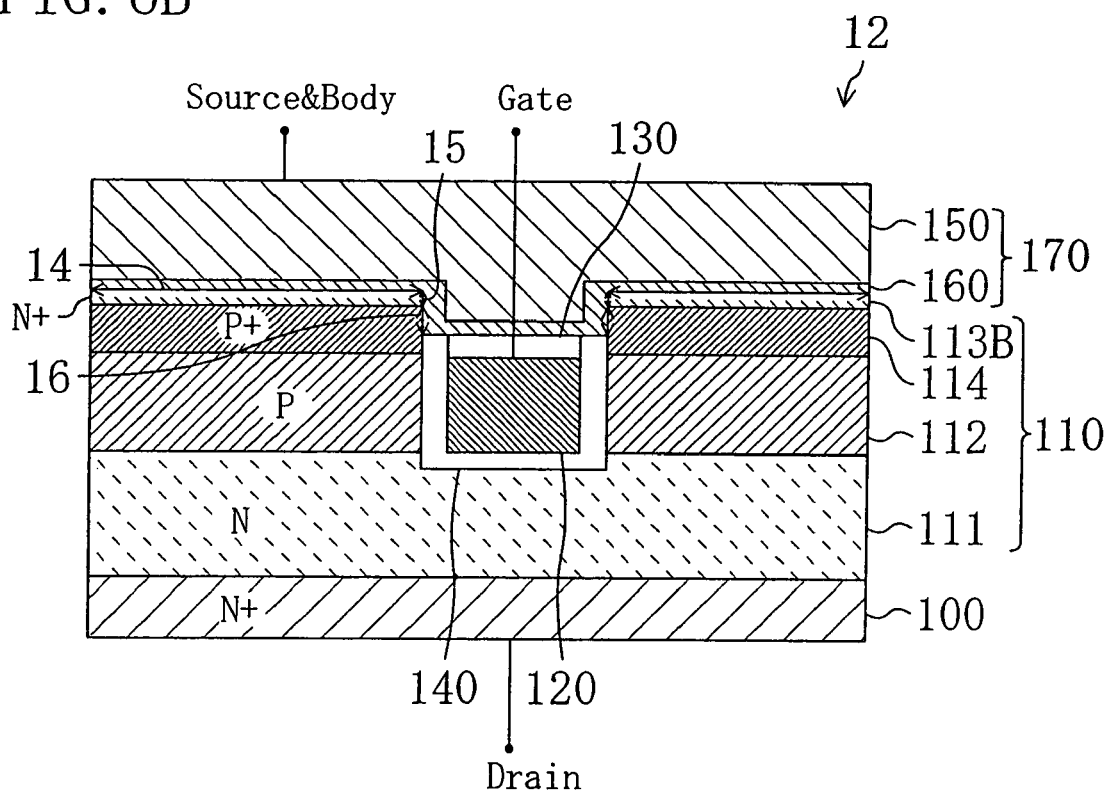
FIG. 6B is a diagram schematically showing a structure in section of a second region for electrical contact with the body region of the transistor in the vertical gate semiconductor device according to the first embodiment of the present invention.

FIG. 6A is a diagram schematically showing the structure in section of a first region 11 functioning as a transistor and FIG. 6B is a diagram schematically showing the structure in section of a second region 12 for electrical contact with the body region. Wherein, in FIG. 6A and FIG. 6B, the same reference numerals have been used for the same components as in FIG. 4A and FIG. 4B and the detailed description thereof is omitted.

A N-channel vertical gate DMOS transistor is exemplified as the vertical gate semiconductor device of the present embodiment. As shown in FIG. 6A and 6B, the vertical gate semiconductor device of the present invention includes: a silicon substrate 100 of a N+-type semiconductor substrate with a N-type (first conductivity type) impurity doped; a semiconductor layer 110 having a N-type drain region 111 and a P-type (second conductivity type) body region 112 which are formed on the silicon substrate 100; a vertical gate electrode 120 buried in a trench (a gate trench), which is formed in the semiconductor layer 110, with an insulating material 140 interposed; a buried insulating film 130 covering the upper face of the vertical gate electrode 120; and a common electrode 170 having a laminated structure of an aluminum film 150 to be a wring material and a barrier metal film 160.

Herein, as one of the significant features of the present embodiment, the vertical gate electrode 120, the insulating film 130 and the insulting material 140 surrounding the vertical gate electrode 120 are buried so as to form a recessed part (above-gate recessed part) in the upper part of the gate trench in each of the first region 11 and the second region 12, and the common electrode 170 is formed on the semiconductor layer 110 including the above-gate recessed part. Wherein, the buried insulating film 130 insulates the vertical gate electrode 120 from the common electrode 170.

Further, as shown in FIG. 6A, the first region 11 functioning as a transistor includes the source region 113A formed on the body region 112 so as to face the upper part of the vertical gate electrode 120. The source region 113A is formed in the upper portion of the semiconductor layer 110, so that the surface of the source region 113A serves as the surface of the semiconductor layer 110. A part of the source region 113A is exposed at the wall face of the above-gate recessed part so that the exposed part 13 and the upper face 14 of the source region 113A are in contact with the common electrode 170. In the N-channel vertical gate DMOS transistor of the present embodiment having the above structure, the source region 113A is insulated electrically from the gate electrode 120 by means of the buried insulating film 130 and the insulating material 140 for realizing a function as a transistor. When a high voltage is applied between the source electrode (i.e., the common electrode 170) and the drain electrode (not shown in the drawings) and a voltage higher than the threshold voltage is applied between the gate electrode 120 and the source region 113A, a n-type inversion layer (i.e., channel layer) is formed at the interface between the insulating material 140 to be a gate insulating film and the P-type body region 112 (i.e., two interface on both sides of the gate electrode 120), as shown in FIG. 6A, so that a current 17 flows from the drain region 111 to the source region 113A through the inversion layer. When the voltage applied to the gate electrode 120 is lower than the threshold voltage, no n-type inversion layer is formed in the body region 112, so that the vertical gate DMOS transistor is in OFF state between the source and the drain.

As shown in FIG. 6B, the second region 12 for electrical contact with the body region 112 includes the body contact region 114 formed on the body region 112 and the source region 113B formed on the body contact region 114. In detail, the source region 113B is formed in the uppermost portion of the semiconductor layer 110 so that the surface of the source region 113B serves as the surface of the semiconductor layer 110, and the surface of the source region 113B covers the upper face of the body contact region 114. The body region 112 and the body contact region 114 are in contact with each other and the body contact region 114 and the source region 113B are in contact with each other. Further, a part of the source region 113B and a part of the body contact region 114 are exposed at the wall face of the above-gate recessed part so that each exposed part 15 and 16 and the upper face 14 of the source region 113B are in contact with the common electrode 170. In detail, the body contact region 114 is in contact with the common electrode 170 at the wall face of the above-gate recessed part and the source region 113B is in contact with the common electrode 170 at the wall face of the above-gate recessed part and the surface of the semiconductor layer 110. In this manner, the common electrode 170 is commonly connected to the source region 113B and the body contact region 114, thereby preventing a parasite bipolar transistor from being in ON state. Specifically, in the case of a device composed of transistors that operate with a low current, the body contact region 114 is set so as to be in contact with the common electrode 170 at the wall face of the above-gate recessed part of which height is, for example, greater than 100 nm, if the area ratio (l:m) between the first region 11 and the second region 12 is 5:1.

Description will be made below about a method for fabricating the above described vertical gate semiconductor device (see FIG. 3 and the like) of the present embodiment by exemplifying a method for fabricating a N-channel vertical gate DMOS transistor, with reference to the drawings.

FIG. 7A through FIG. 7F, FIG. 8A through FIG. 8F, FIG. 9A through FIG. 9F, FIG. 10A through FIG. 10F and FIG. 11A through FIG. 11F are sections showing steps of the method for fabricating the vertical gate semiconductor device of the present embodiment. Wherein, FIGS. 7A, 7C and 7E, FIGS. 8A, 8C and 8E, FIGS. 9A, 9C and 9E, FIGS. 10A, 10C and 10E and FIGS. 11A, 11C and 11E show states in which the first region 11 functioning as a transistor is formed, and FIGS. 7B, 7D and 7F, FIGS. 8B, 8D and 8F, FIGS. 9B, 9D and 9F, FIGS. 10B, 10D and 10F and FIGS. 11B, 11D and 11F show states in which the second region 12 for electrical contact with the body region of the transistor is formed. As described above, the first region 11 and the second region 12 are arranged adjacent to each other alternately along a direction along which the trench gate extends. In FIG. 7A through FIG. 7F, FIG. 8A through FIG. 8F, FIG. 9A through FIG. 9F, FIG. 10A through FIG. 10F and FIG. 11A through FIG. 11F, the same reference numerals are assigned to the same components as those in FIG. 3, FIG. 4A and FIG. 4B and the detailed description thereof is omitted.

Figure 7A:
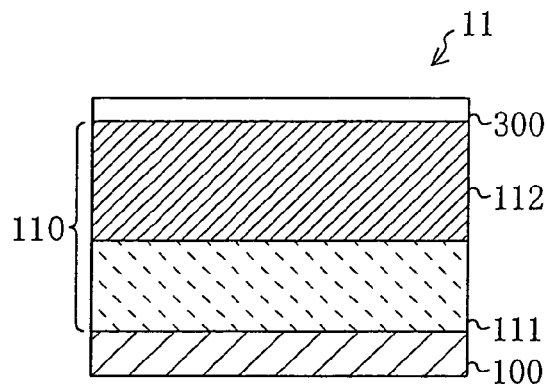
Figure 7B:
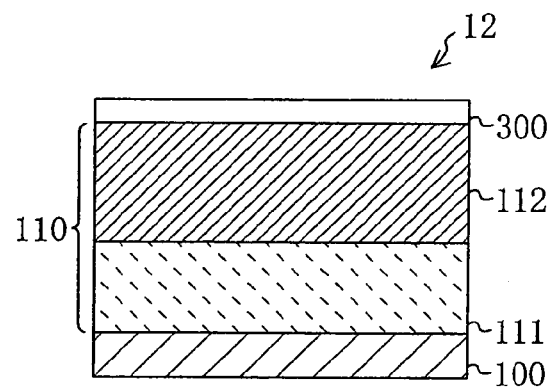

First, as shown in FIG. 7A and FIG. 7B, after a lightly doped first conductivity type (e.g., N-type) semiconductor layer (epitaxial layer) 110 is formed on a silicon substrate 100 of a heavily doped first conductivity type (e.g., N+-type) semiconductor substrate by, for example, an epitaxial growth method, the second conductivity type (e.g., P-type) impurity is implanted to the upper portion of the semiconductor layer 110. Whereby, the semiconductor layer 110 composed of the first conductivity type (e.g., N-type) drain region 111 and the second conductivity type (e.g., P-type) body region 112 formed thereon is formed in each of the first region 11 and the second region 12. Subsequently, a silicon oxide film 300 having a thickness of about 50 to 500 nm is formed on the surface of the semiconductor layer 110 by, for example, thermal oxidation. It is noted that the body region 112 may be formed by ion implantation or epitaxial growth. Wherein, in order to obtain a stable impurity concentration of the body region 112 where a channel layer is to be formed, the epitaxial growth is the most suitable method for forming the body region 112.

Figure 7C:
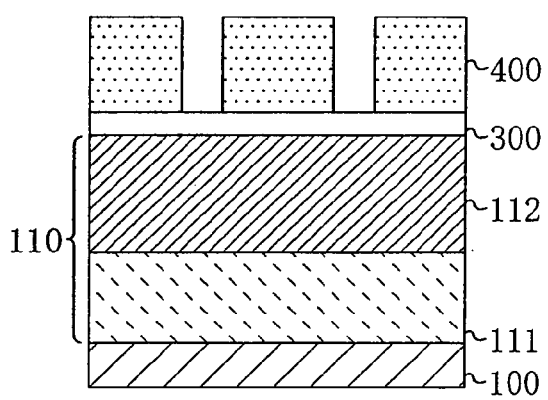
Figure 7D:
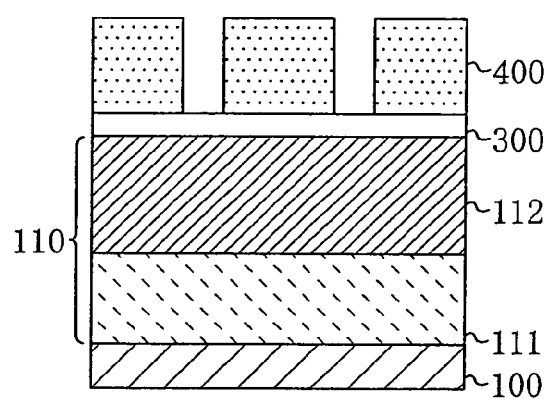
Figure 7E:
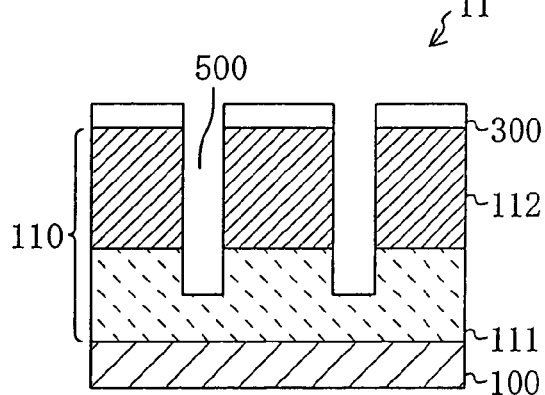
Figure 7F:
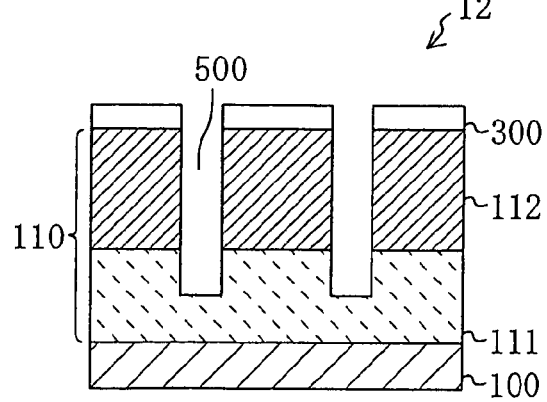

Next, as shown in FIG. 7C and FIG. 7D, a resist pattern 400 having an opening at a portion corresponding to the gate trench formation region is formed on the silicon oxide film 300. Subsequently, dry etching is performed to the silicon oxide film 300, using the resist pattern 400 as a mask. After removing the resist pattern 400 as shown in FIG. 7E and FIG. 7F, dry etching is performed to the semiconductor layer 110 using the thus patterned silicon oxide film 300 as a mask, whereby a plurality of trenches 500 are formed each of which passes through the body region 112 and reaches the upper part of the drain region 111. The depth of each trench 500 is in a range between about 0.8 and 3.0 μm, for example, and the intervals between the trenches 500 are equal in the case where three or more trenches 500 are arranged. The trenches 500 extend continuously across the body region 112 in the first region 11 and the second region 12.

Figure 8A:
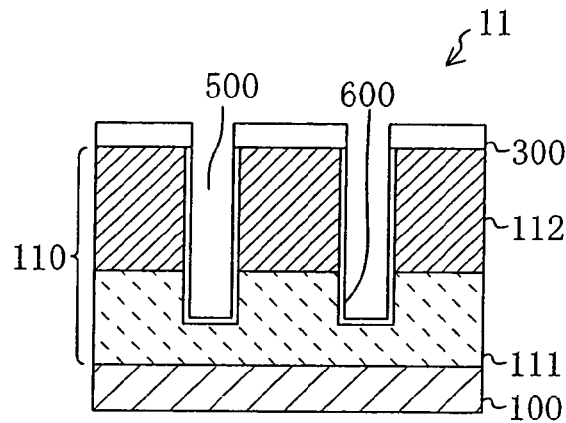
Figure 8B:
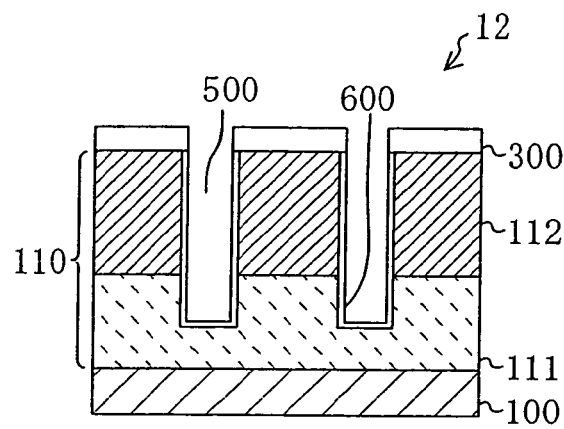

Next, as shown in FIG. 8A and FIG. 8B, in order to remove a damaged layer at the wall part and the bottom part of each trench 500, a silicon oxide film 600 having a thickness of 200 to 100 nm is formed at the wall part and the bottom part of each trench 500 by thermal oxidation, for example.

Figure 8C:
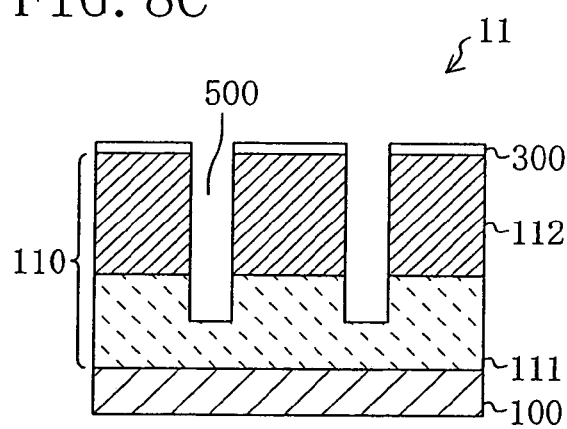
Figure 8D:
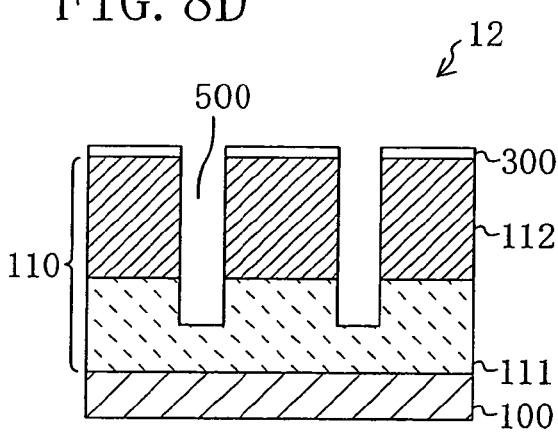

Next, as shown in FIG. 8C and FIG. 8D, the silicon oxide film 600 formed on the inner wall of each trench 500 is removed by wet etching, for example. Though the silicon oxide film 300 on the semiconductor layer 110 is also etched to same extent at this time, the silicon oxide film 300 has a sufficient thickness on the semiconductor layer 110 even after the removal of the silicon oxide film 600.

Figure 8E:
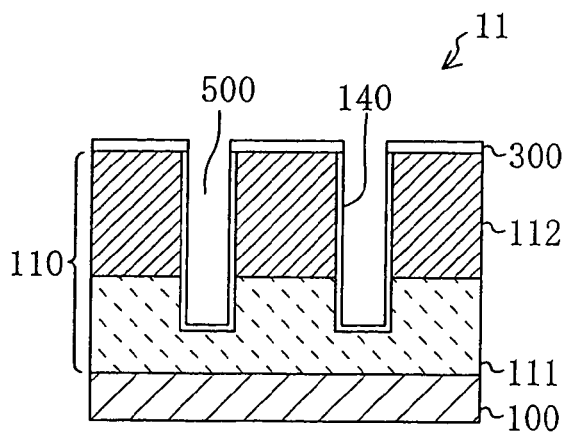
Figure 8F:
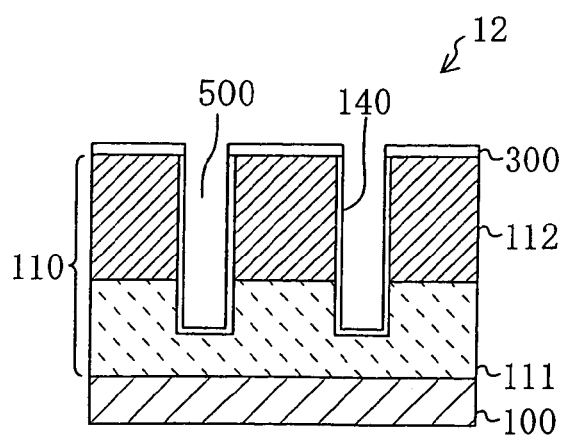

Then, as shown in FIG. 8E and FIG. 8F, an insulating material 140, which is, for example, an oxide film or the like having a thickness of about 8 to 100 nm, is formed on the wall face and the bottom face of each trench 500. The insulating material 140 is $SiO_2$ and functions as a gate insulating film.

Figure 9A:
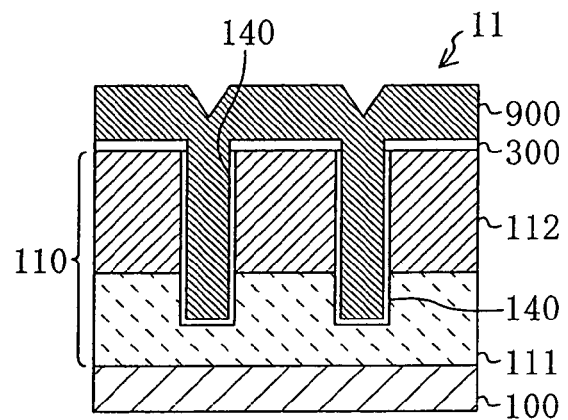
Figure 9B:
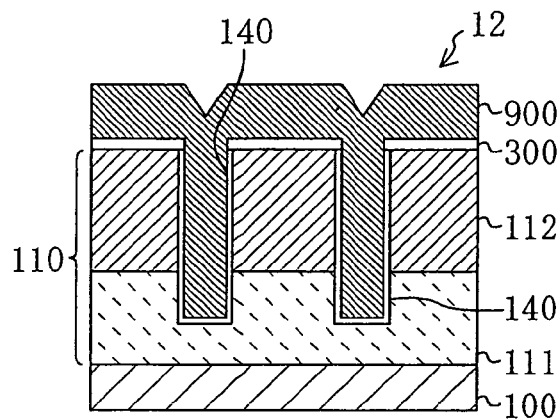

Then, as shown in FIG. 9A and FIG. 9B, after a conductive film to be a material of the gate electrode, for example, a polysilicon layer 900 is deposited on the surface of the silicon oxide film 300 including the inner wall of each trench 500, an impurity for forming a gate electrode is implanted to the polysilicon film 900, and then, a thermal treatment is performed. In this treatment, the polysilicon layer 900 is deposited to have a thickness of, for example, 300 to 8000 nm on the surface of the silicon oxide film 300. It is noted that it is possible to deposit a polysilicon film, in which an impurity (e.g., phosphorus) for forming a gate electrode is doped, directly on the silicon oxide film 300 by, for example, CVD (chemical vapor deposition), instead that the impurity implantation is performed separately after the deposition of the polysilicon film 900.

Figure 9C:
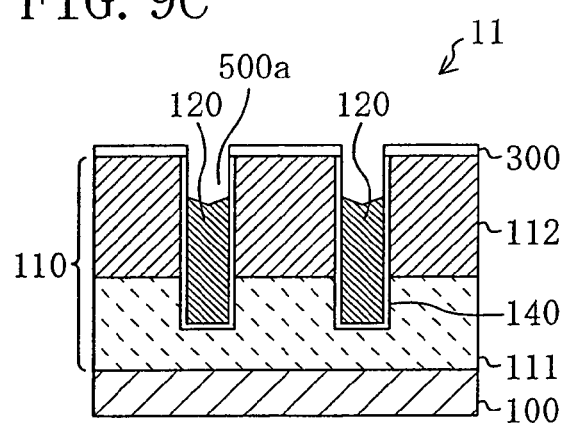
Figure 9D:
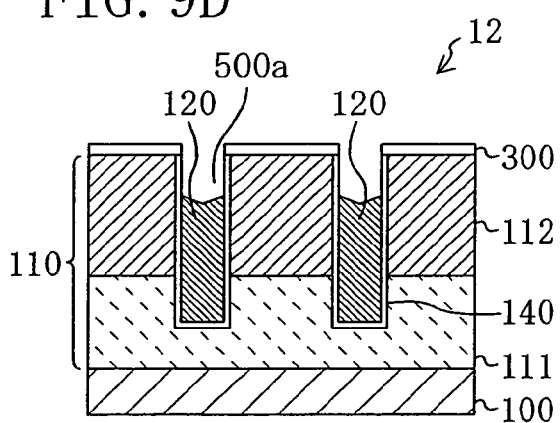

Then, as shown in FIG. 9C and FIG. 9D, etching is performed to the entirety of the polysilicon film 900 to remove a part of the polysilicon film 900 located over the surface of the silicon oxide film 300 and a part of the polysilicon film 900 located in the upper part of each trench 500, so that the vertical gate electrode 120 is formed inside each trench 500. The dry etching to the polysilicon film 900 in each trench 500 is performed to etch it down to, for example, about 200 to 800 nm from the surface of the silicon oxide film 300. Accordingly, a concave part 500*a* is formed above the vertical gate electrode 120 in each trench 500.

Figure 9E:
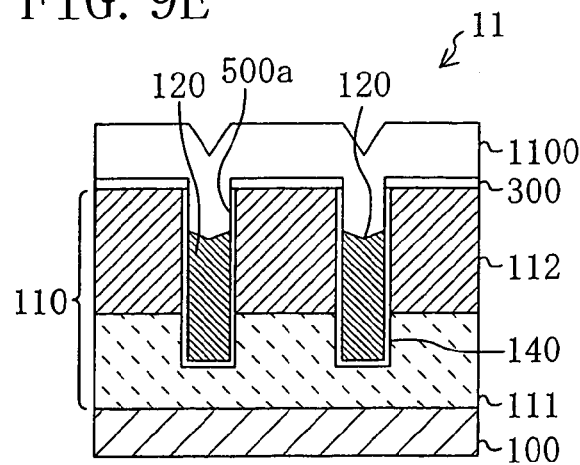
Figure 9F:
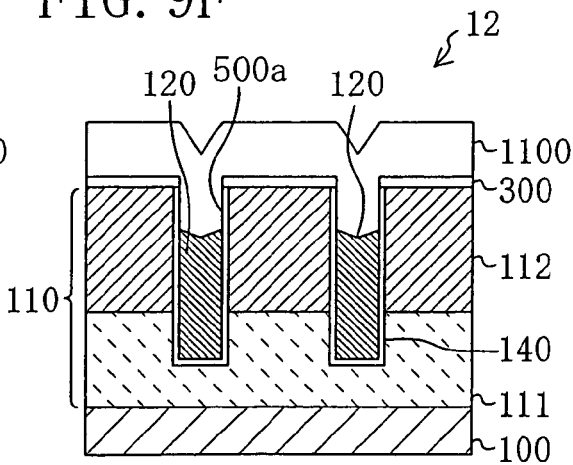

Subsequently, as shown in FIG. 9E and FIG. 9F, a silicon oxide film 1100 is formed to have a thickness of, for example, about 400 to 800 nm on the surface of the silicon oxide film 300 and in the concave part 500*a* to fill the concave part 500*a*.

Next, as shown in FIG. 10A and FIG. 10B, etch back for planarization using a resist is performed to the silicon oxide film 1100 and the silicon oxide film 300 sequentially to remove the silicon oxide film 300 and the silicon oxide film 1100 so as to equalize the level of the uppermost face of the silicon oxide film 1100 in the concave part 500*a* above the vertical gate electrode 120 to the level of the surface of the semiconductor layer 110. Whereby, each trench 500 is filled with the silicon oxide film 1100 and the vertical gate electrode 120.

Subsequently, as shown in FIG. 10C and FIG. 10D, a second conductivity type impurity (e.g., P-type boron) 1350 is implanted to the surface portion of the semiconductor layer 110 of the second region 12, using a resist pattern 1300 covering the semiconductor layer 110 of the first region 11 as a mask. Thus, the second conductivity type (e.g., P+-type) body contact region 114 having a higher impurity concentration than that of the body region 112 is formed in the surface portion of the semiconductor layer 110 of the second region 12, namely, over the body region 112 of the second region 12.

Next, after removing the resist pattern 1300, a first conductivity type impurity (e.g., N-type phosphorus) 1450 is implanted to the surface portion of the semiconductor layer 110 of the first region 11, using a resist pattern 1400 covering the semiconductor layer 110 of the second region 12 as a mask, as shown in FIG. 10E and FIG. 10F. Thus, the first conductivity type (e.g., N+-type) source region 113A is formed in the surface portion of the semiconductor layer 110 of the first region 11, namely, over the body region 112 of the first region 11.

Figure 11A:
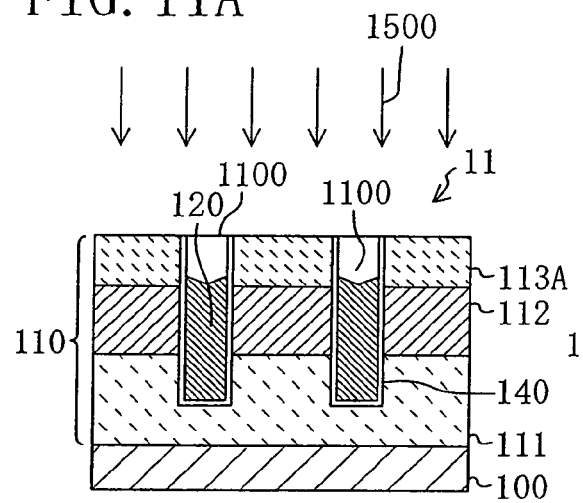
Figure 11B:
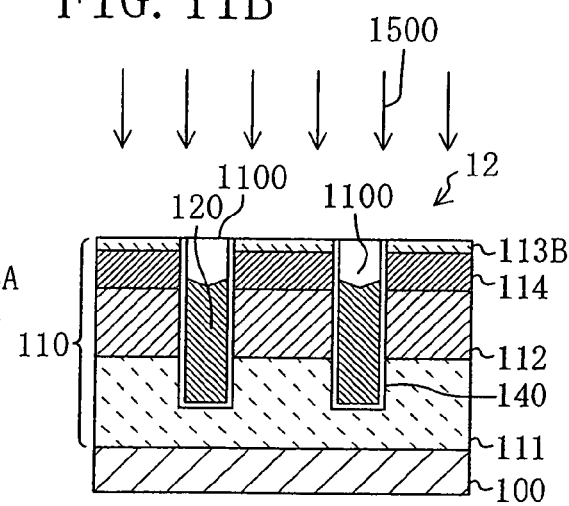

Next, after removing the resist pattern 1400, a first conductivity type impurity (e.g., N-type phosphorus) 1500 is implanted to the entire surface portion of the semiconductor layer 110, as shown in FIG. 11A and FIG. 11B. Thus, the first conductivity type (e.g., N+-type) source region 113B is formed in the surface portion of the semiconductor layer 110 of the second region 12. It is noted that the depth of the source region 113B is shallower than the depth of the body contact region 114 in the semiconductor layer 110 of the second region 12. Namely, the ion implantation is performed so that the N+-type source region 113B is formed in the upper portion of the P+-type body contact region 114. Also, the thickness of the source region 113B of the second region 12 is smaller than the thickness of the source region 113A of the first region 11. Because, the N-type impurity (phosphorus), which is a reverse conductivity type of the P-type in the body contact region 114, is implanted. In the present embodiment, the source region 113B is formed so as to cover the entirety of the body contact region 114 of the second region 12. The impurity concentration of the source region 113A is a sum of each concentration of the implanted impurities 1450 and 1500.

Figure 11C:
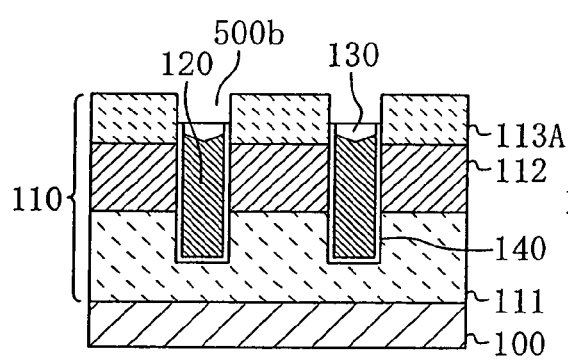
Figure 11D:
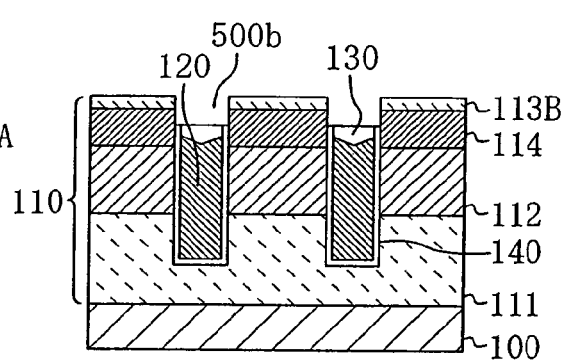

Next, as shown in FIG. 11C and FIG. 11D, respective parts of the silicon oxide film 1100 and the insulating material 140 on the vertical gate electrode 120 in each trench 500 are removed by dry etching, for example. Thus, a recessed part 500*b* is formed above the vertical gate electrode 120 in each trench 500. Also, the silicon oxide film 1100 remains as a buried insulating film 130 on the vertical gate electrode 120 for electrically insulating the vertical gate electrode 120 from the common electrode 170 (see FIG. 11E and FIG. 11F).

The etching to the silicon oxide film 1100 and the insulating material 140 on the vertical gate electrode 120 shown in FIG. 11C and FIG. 11D is performed so as to expose the source region 113A at the wall face of the recessed part 500*b* of the first region 11 and so as to expose the body contact region 114 and the source region 113B at the wall face of the recessed part 500*b* of the second region 12. In detail, the dry etching to the silicon oxide film 1100 and the insulating material 140 in each trench 500 is performed to etch them down to about 100 to 300 nm, for example, from the surface of the semiconductor layer 110.

Figure 11E:
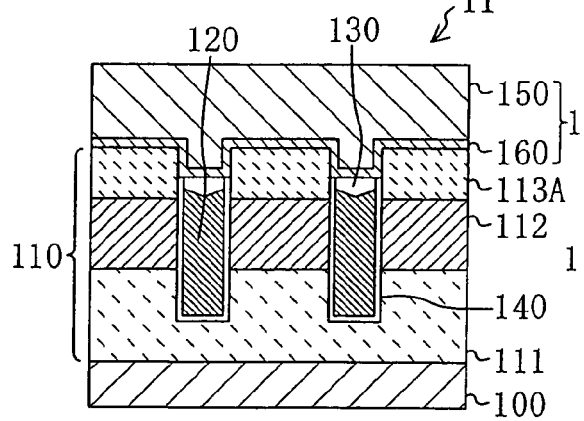
Figure 11F:
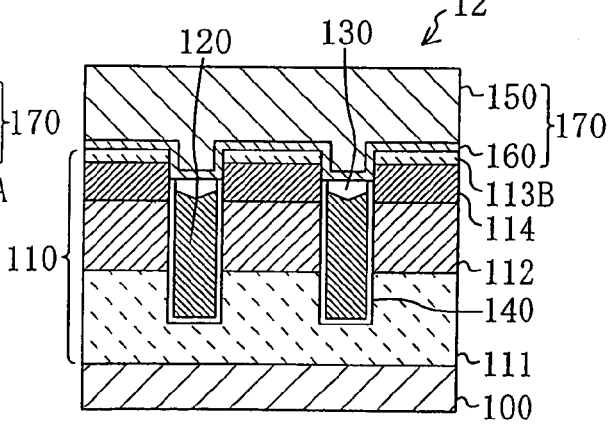

Next, as shown in FIG. 11E and FIG. 11F, after the barrier metal film 160 and the conductive film (e.g., aluminum film) 150 for wiring are sequentially deposited on the surface of the semiconductor layer 110 including a part on the buried insulating film 130 in the recessed part 500*b*, the aluminum film 150 and the barrier metal film 160 are patterned to form the common electrode 170. Thus, the source region 113A and the common electrode 170 are electrically connected to each other at the wall face of the recessed part 500*b* of the first region 11. Further, it is needless to say that the source region 113A is electrically connected to the common electrode 170 at the upper face thereof. In addition, at the wall face of the recessed part 500*b* of the second region 12, the body contact region 114 and the source region 113B are electrically connected to the common electrode 170. In other words, the source region 113B and the body contact region 114 are surely connected to the electrode 170 commonly at the wall face of each gate trench 500 of the second region 12. Also, it is needless to say that the source region 113B is electrically connected at the upper face thereof to the common electrode 170.

In the above described first embodiment, the source region 113B electrically connected to the source region 113A of the first region 11 functioning as a transistor is formed over the body region 112 (specifically, the body contact region 114 in the upper portion of the body region 112) in the second region 12 for electrical contact with the body region 112. In other words, the surface of the source region 113B, instead of the surface of the body contact region 114, serves as the surface of the semiconductor layer 110 in the vicinity of each trench 500. Therefore, the contact area between the common electrode 170 and the source region can be sufficiently ensured without reduction of the layout area of the body contact region 114 even in the case where the intervals between the gate electrodes 120 are shortened in association with size reduction of the device. Hence, a compact vertical gate semiconductor device is realized with no increase in contact resistance of the source region.

In the first embodiment, the body region 112 (specifically, the body contact region 114 in the upper portion of the body region 112) of the second region 12 is electrically connected through the wall face of the recessed part 500b (see FIG. 11D and FIG. 11F) on the gate electrode 120 in each trench 500, and therefore, the contact area between the common electrode 170 and the body contact region 114 can be surely ensured. Hence, a potential difference is prevented from being caused in the body region 112 in the operation of the transistors, with a result that operation of a parasite bipolar transistor can be prevented.

In the first embodiment, the source regions 113A and 113B are formed in the entire surface of the semiconductor layer 110 and on the wall part of each trench 500. In other words, as shown in FIG. 5, the respective surfaces of the source regions 113A and 113B serve as the surface of the semiconductor layer 110 and the source regions 113A and 113B are exposed at the wall face of the recessed part 500b above the gate electrode 120. Accordingly, each exposed part and the respective surfaces (the upper faces) of the source regions 113A and 113B are in contact with the common electrode 170, so that the contact area between the common electrode 170 and the source region is increased, with a result of further reduction of the contact resistance of the source region. Specifically, in comparison with the case where the source region is not formed in the entire surface portion of the semiconductor layer 110 as in conventional cases, namely, the case where the source region is not formed over the body contact region 114 of the second region 12, ON resistance of the transistors can be reduced.

In the first embodiment, in addition to electrical contact of both the first region 11 and the second region 12 with the source regions 113A and 113B, the body region 112 (the body contact region 114) is in electrical contact in common to the source region 113B in the second region 12. Hence, the intervals between the gate electrodes 120 can be reduced, and accordingly, further size reduction of the device is promoted.

In the first embodiment, the source region 113B of the second region 12 is smaller in thickness than the source region 113A of the first region 11. Therefore, the electrical contact of the source region 113B and the body contact region 114 through the wall face of each trench 500 (specifically, the recessed part 500b) of the second region 12 can be ensured even in the case where the depth of each gate trench 500 of the second region 12 is the same as that of each gate trench 500 of the first region 11.

Further, in the first embodiment, the source region 113B covers the entirety of the body contact region 114 of the second region 12. Therefore, the formation of the gate electrode 120 to form the recessed part 500b in the upper part of each trench 500 allows the source region 113A and 113B to be in electrical contact through the wall face of the recessed part 500b in each of the first region 11 and the second region 12.

Furthermore, in the first embodiment, the body contact region 114 having a higher impurity concentration than that of the other part of the body region 112 is formed in the upper portion of the body region 112 of the second region 12, and hence, the electrical contact with the body region 112 is further ensured.

Moreover, in the first embodiment, the source regions 113A and 113B are formed after the formation of the trenches 500, with a result that the thermal treatment step after the formation of the source regions can be moderated. Accordingly, impurity diffusion in the source regions 113A and 113B can be controlled, and therefore, the device dimension can be accurately controlled. Hence, transistor characteristics as designed can be easily attained.

In addition, in the first embodiment, the impurity is introduced to parts to be the source regions 113A and 113B of the semiconductor layer 110 by ion implantation simultaneously with the formation of the source region 113B of the second region 12. In other words, the ion implantation is performed to the entirety of the semiconductor layer 110. As a result, the source region 113B can be formed without an additional lithography step involved.

It is noted that in the first embodiment, the step of forming the source region 113A of the first region 11 shown in FIG. 10E and FIG. 10F is performed after the step of forming the body contact region 114 shown in FIG. 10C and FIG. 10D. However, it is, of course, possible to perform the step of forming the body contact region 114 after the step of forming the source region 113A of the first region 11.

Second Embodiment

A vertical gate semiconductor device and a method of fabricating it according to the second embodiment of the present invention will be described below with reference to the drawings. It is noted that the vertical gate semiconductor device in the present embodiment is intended to compact the device without increase in contact resistance of the source region invited, similar to the first embodiment.

Figure 13A:
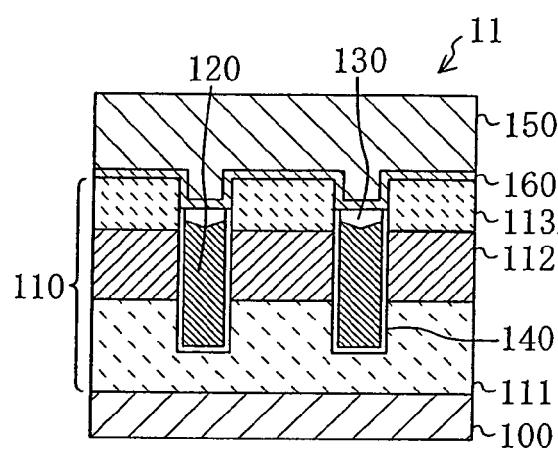
Figure 13B:
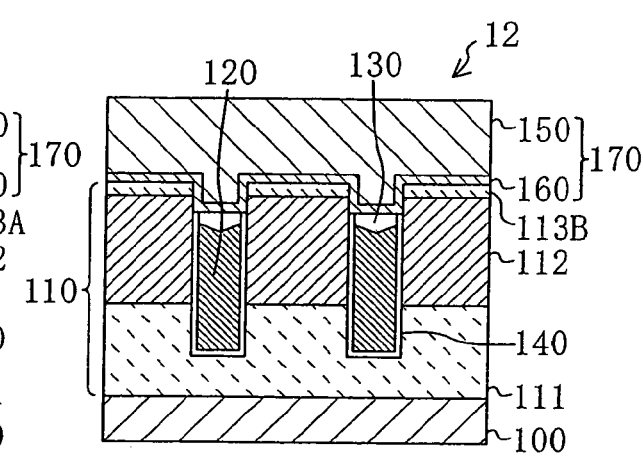

The difference of the present embodiment from the first embodiment is that a region (corresponding to the body contact region 114 in the first embodiment) having a relatively high impurity concentration (e.g., $5 \times 10^{19}$ to $1 \times 10^{20}$ count/cm$^3$) is not formed in the upper portion of the body region 112 having a relatively low impurity concentration (e.g., in the order of $10^{17}$ count/cm$^3$) in the second region 12 (see FIG. 11B and FIG. 13B). Wherein, the body region 112 of the second region 12 in the present embodiment has an impurity concentration (e.g., in the order of $10^{18}$ count/cm$^3$) which enables sufficient Ohmic contact with the common electrode 170.

The vertical gate semiconductor device fabricating method in the present embodiment is the same as in the first embodiment until the step shown in FIG. 10A and FIG. 10B. Namely, in the present embodiment, the same steps as in the first embodiment respectively shown in FIG. 7A through FIG. 7F, FIG. 8A through FIG. 8F, FIG. 9A through FIG. 9F and FIG. 10A and FIG. 10B are performed in the present embodiment. FIG. 12A through FIG. 12F and FIG. 13A and FIG. 13B are sections respectively showing the steps after the steps shown in FIG. 10A and FIG. 10B in the vertical gate semiconductor device fabricating method of the present embodiment. Wherein, FIG. 12A, FIG. 12C, FIG. 12E and FIG. 13A show states in which the first region 11 functioning as a transistor is formed and FIG. 12B, FIG. 12D, FIG. 12F and FIG. 13B show states in which the second region 12 for electrical contact with the body region of the transistor is formed. As described above, the fist region 11 and the second region 12 are arranged alternately along the direction along which each trench gate extends so as to be adjacent to each other. Further, the same reference numerals as in FIG. 3, FIG. 4A, FIG. 4B and the like are assigned to the same components in FIGS. 12A through 12F and FIG. 13A and FIG. 13B and the detailed description thereof is omitted.

Specifically, in the present embodiment, after the step shown in FIG. 10A and FIG. 10B, the impurity implantation is not performed for forming the body contact region (the step shown in FIG. 10C and FIG. 10D in the first embodiment) and the first conductivity type impurity (e.g., N-type phosphorus) 1450 is implanted to the surface portion of the semiconductor layer 110 of the first region 11, using the resist pattern 1400 covering the semiconductor layer 110 of the second region 12 as a mask. Thus, the first conductivity type (e.g., N$^+$-type) source region 113A is formed in the surface portion of the semiconductor layer 110 of the first region 11, namely, over the body region 112 of the first region 11.

Figure 12A:
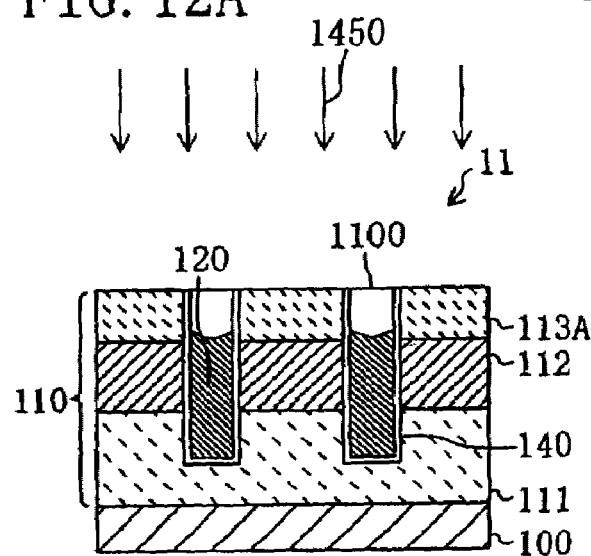
Figure 12B:
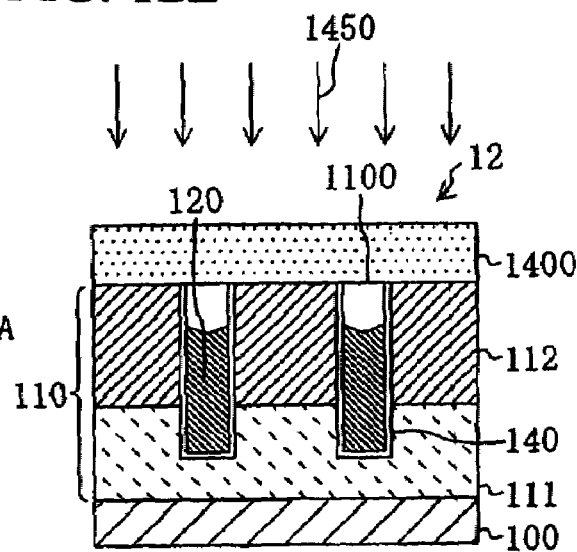
Figure 12C:
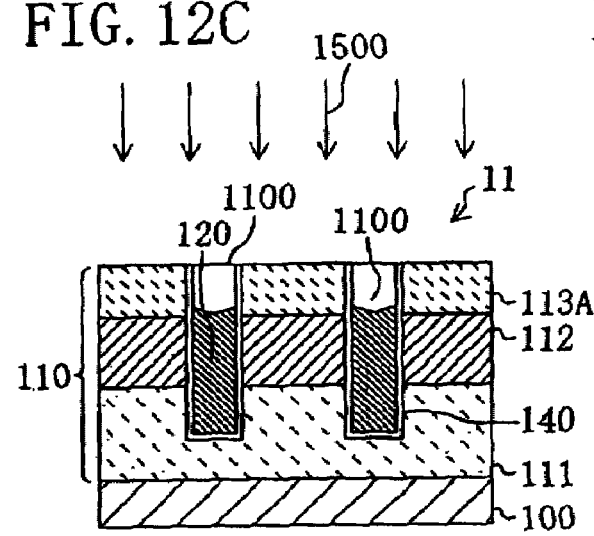
Figure 12D:
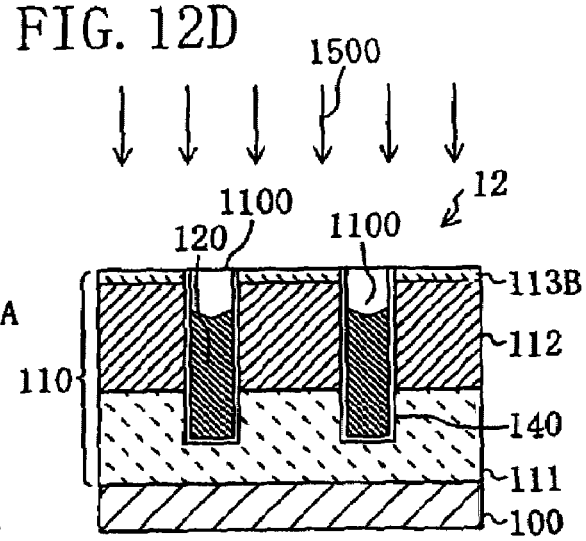

Next, after removing the resist pattern 1400, the first conductivity type impurity (e.g., N-type phosphorus) 1500 is implanted to the entirety of the surface portion of the semiconductor layer 110, as shown in FIG. 12C and FIG. 12D. Thus, the first conductivity type (e.g., N+-type) source region 113B is formed in the surface portion of the semiconductor layer 110 of the second region 12, namely, over the body region 112 of the second region 12. It is noted that the source region 113B of the second region 12 is smaller in thickness than the thickness of the source region 113A of the first region 11. Also, in the present embodiment, the source region 113B is formed so as to cover the entirety of the body region 112 of the second region 12.

Figure 12E:
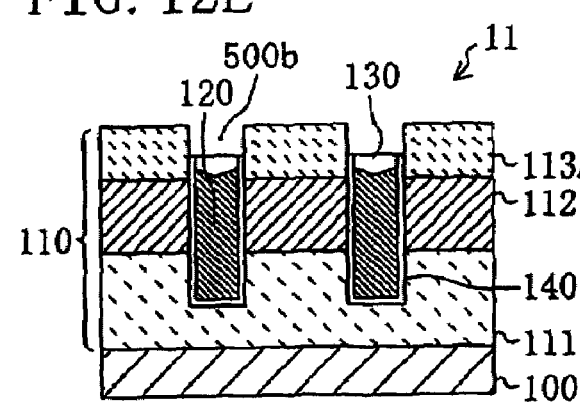
Figure 12F:
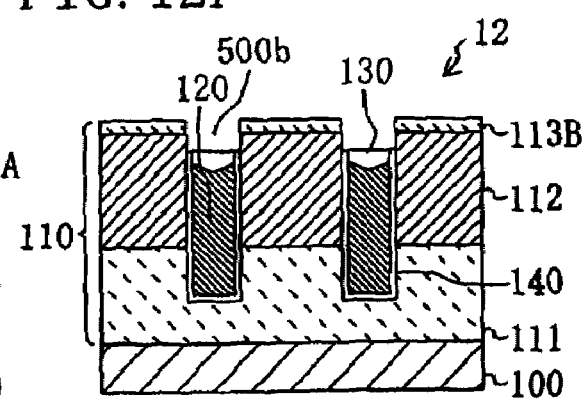

Next, as shown in FIG. 12E and FIG. 12F, respective parts of the silicon oxide film 1100 and the insulating material 140 on the vertical gate electrode 120 in each trench 500 are removed by dry etching, for example. Thus, the recessed part 500b is formed above the vertical gate electrode 120 in each trench 500. Also, the silicon oxide film 1100 remains on the vertical gate electrode 120 as the buried insulating film 130 for electrically insulting the vertical gate electrode 120 from the common electrode 170 (see FIG. 13A and FIG. 13B).

It is noted that the etching to the silicon oxide film 1100 and the insulating material 140 on the vertical gate electrode 120 shown in FIG. 12E and FIG. 12F is performed so as to expose the source region 113A at the wall face of the recessed part 500b of the first region 11 and so as to expose the body region 112 and the source region 113B at the wall face of the recessed part 500b of the second region 12. In detail, the dry etching to the silicon oxide film 1100 and the insulating material 140 in each trench 500 is performed to etch them down to about 100 to 300 nm from the surface of the semiconductor layer 110.

Then, as shown in FIG. 13A and FIG. 13B, after the barrier metal film 160 and the conductive film (e.g., aluminum film) 150 for wiring are sequentially deposited on the surface of the semiconductor layer 110 including a part on the buried insulating film 130 in the recessed part 500b, the aluminum film 150 and the barrier metal film 160 are patterned to form the common electrode 170. Thus, the source region 113A and the common electrode 170 are electrically connected to each other at the wall face of the recessed part 500b of the first region 11. Also, the body region 112 and the source region 113B are electrically connected to the common electrode 170 through the wall face of the recessed part 500b of the second region 12. Hence, the source region 113B and the body region 112 are surely connected in common to the electrode 170 at the wall face of each gate trench 500 of the second region 12.

According to the second embodiment as described above, in addition to the same effects as in the first embodiment obtainable, the fabrication process can be simplified because the step of forming the body contact region is unnecessary.

While the first and second embodiments refer to a N-channel vertical gate DMOS transistor as a vertical gate semiconductor device, the vertical gate semiconductor device may be, of course, a P-channel vertical gate DMOS transistor. In the case of a P-channel vertical gate DMOS transistor, the first conductivity type and the second conductivity type are P-type and N-type in the above description, respectively, and the source region, the drain region and the semiconductor substrate shall be P-type and the body region and the body contact region shall be N-type.

In the first or second embodiment, the thickness of the source region 113B of the second region 12 is set smaller than the thickness of the source region 113A of the first region 11. Instead, by setting, for example, the depth of each trench 500 in the first region 11 to be different from the depth of each trench 500 in the second region 12 (wherein, the body region 112 or the body contact region 114 must be exposed at the wall face of each trench in the second region 12.), the thickness of the source region 113A may be set equal to the thickness of the source region 113B.

In the first or second embodiment, the source region 113B is formed over the entirety of the body region 112 or the body contact region 114 of the second region 12. Instead, the source region 113B may be formed so as to partially cover the surface (upper face) of the body region 112 or of the body contact region 114. In this case, in addition to the electrical contact of the body region 112 or the body contact region 114 with the common electrode 170 through the wall face of each trench 500 (precisely, the recessed part 500b) in the second region 12, the surface (to be the semiconductor layer 110 of the second region 12) of a part where the source region 113B is not formed in the body region 112 or the body contact region 114 may be in electrical contact with the common electrode 170.

In both of the first and second embodiments, the width of each trench in which the gate electrode 120 is buried and the intervals between the trenches are set to 0.25 μm and the depth of the trenches is set to 1.25 μm. However, the trench MOS in each embodiment is suitable for application to a microstructure, and therefore, it is possible to set the width of each trench and intervals between the trenches to 0.25 μm or less and to set the aspect ratio of the trenches to 5 or more. By this miniaturization of the width or the like of the trenches, the number of the trenches can be set to 1500 or more.

Figure 14B:
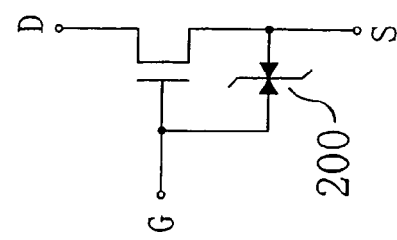
FIG. 14B is a diagram schematically showing a circuit structure of the device shown in FIG. 14A.
Figure 14A:
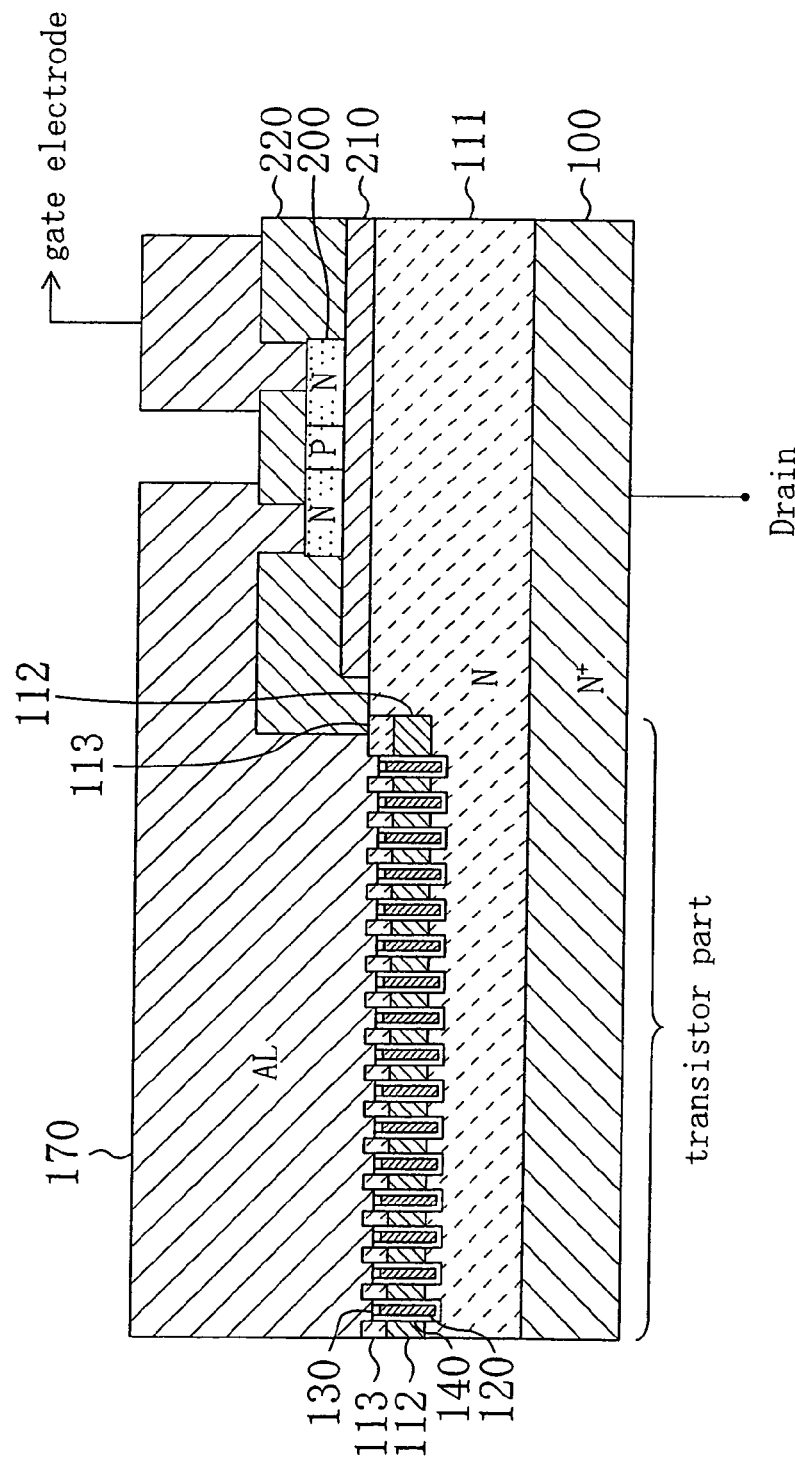
FIG. 14A is a section showing a sate where a Zener diode is provided in the vicinity of a transistor part in the vertical gate semiconductor device according to the first or second embodiment of the present invention.

Further, in the first or second embodiment, as shown in FIG. 14A, a N/P/N Zener diode 200 of, for example, polysilicon, which is formed on the upper part of a Si epitaxial substrate 100 with being insulated by a Si oxide film 210, may be formed in the vicinity of the transistor part composed by forming the plural trenches of the N-channel vertical gate DMOS transistor of each embodiment. Herein, FIG. 14A is the section of the vertical gate semiconductor device and shows, in addition to the transistor part shown in, for example, FIG. 3, a part beside it in the transverse direction thereof (a direction intersecting at right angle with a direction along which the gate extends). Further, as shown in FIG. 14B, the Zener diode 200 is connected, as a diode for protection, between the gate electrode and the source electrode of the N-channel vertical gate DMOS transistor, thereby increasing the electrostatic breaking strength.

Wherein, the actual number of the trenches in which the gate electrodes 120 are buried is about 1500. Further, as shown in FIG. 14A, the Al film (precisely, a laminated film of the barrier metal film 160 and the aluminum film 150) is formed on the transistor part as the common electrode 170. The common electrode 170 is connected to the source region 113, which is the semiconductor layer made of N-type polysilicon. The source region 113 is in contact with the body region 112, which is the semiconductor layer made of P-type polysilicon. The body region 112 is in contact with the drain region 111, which is the semiconductor layer made of N-type polysilicon. Also, the drain region 111 is electrically connected to the drain electrode. On the other hand, each N-type semiconductor region of the Zener diode 200 is electrically connected to the common electrode 170 through a contact hole formed in an interlayer insulating film 220 on the Zener diode 200.

In addition, the Zener diode 200 made of polysilicon can be formed in such a manner that non-doped polysilicon is formed simultaneously with the formation of the gate electrode 120 and an impurity is implanted to a predetermined region made of the polysilicon.

The present invention relates to a vertical gate semiconductor device and attains an effect that the device can be compacted without increase in contact resistance of the source region particularly in application to electronics equipment such as a DC-DC converter. Hence, the present invention has a higher practical value.

The invention claimed is:

1. A vertical trench gate transistor semiconductor device comprising:
   a drain region;
   a first body region formed over said drain region;
   a second body region formed over said drain region and extending to said first body region;
   a first source region formed over said first body region;
   a second source region formed over said second body region and electrically connected to said first source region;
   a trench formed through said first source region, said second source region, said first body region and said second body region; and
   a gate disposed in said trench;
   wherein said second source region functions as an electrical contact for the first source region, and the second body region functions as an electrical contact for the first body region.

2. The vertical gate transistor semiconductor device of claim 1, wherein
   a thickness of said second source region is smaller than a thickness of said first source region.

3. The vertical gate transistor semiconductor device of claim 1, wherein
   said second source region covers an entirety of said second body region.

4. The vertical gate transistor semiconductor device of claim 1, wherein
   an impurity concentration of an upper part of said second body region is higher than an impurity concentration of a lower part of said second body region.

5. The vertical gate transistor semiconductor device of claim 1, wherein
   a gate region is formed so as to form a recessed part in an upper part of said trench, and
   said second body region is exposed at a wall face of said recessed part.

6. The vertical gate transistor semiconductor device of claim 1, wherein
   a gate region is formed so as to form a recessed part in an upper part of said trench, and
   said first source region and said second source region are exposed at respective wall faces of said recessed part and are in electrical contact through said respective exposed parts and respective upper faces of said respective source regions.

7. The vertical gate transistor semiconductor device of claim 5, wherein
   said second body region includes, in an upper portion thereof, a heavily doped region of which impurity concentration is relatively high, and
   said heavily doped region is exposed at the wall face of said recessed part and is in electrical contact through said exposed part.

8. The vertical gate transistor semiconductor device of claim 5, wherein
   said second source region and said second body region are exposed at the wall face of said recessed part and are in electrical contact through said respective exposed parts.

9. The vertical gate transitor semiconductor device of claim 5, further comprising
   an additional electrode is overlaying on said second source region and the gate with an insulating layer interposed, and
   said additional electrode is in contact with said second source region and said second body region at the wall face of said recessed part.

10. A vertical gate transistor semiconductor device characterized by comprising:
    a drain region;
    a first body region formed over said first drain region;
    a second body region formed over said second drain region and extending to said first drain region;
    a first source region formed over said first body region;
    a second source region formed over said second body region and electrically connected to said first source region;
    a trench formed through said first source region and said first body region; and
    a trench formed through said second source region, the second source region, the first body region and the second body region; and
    a gate disposed in the trench;
    wherein the second source region functions as an electrical contact for the first source region, and the second body region functions as an electrical contact for the first body region,
    a gate region is formed so as to form a recessed part in an upper part of said trench, and
    said second body region is exposed at a wall face of said recessed part and is in electrical contact through said exposed part.

11. The vertical gate transistor semiconductor device of claim 10, wherein
    a second source region electrically connected to said first source region
    an additional electrode is overlaying on gate region and on said first source region and said second source region with an insulating layer interposed, and
    said additional electrode is in contact with said second source region and said second body region at the wall face of said recessed part.

12. The vertical gate trench semiconductor device of claim 11, wherein
said additional electrode is in electrically contact with respective said first source region and said second source region.

13. The vertical gate trench semiconductor device of claim 10, wherein
a second source region is electrically connected to said first source region and is thinner than said first source region.

14. The vertical gate trench semiconductor device of claim 10, wherein
said second body region includes an upper portion whose impurity concentration is higher than an impurity concentration of a lower portion threreof, and
said upper portion is exposed at the wall face of said recessed part and is in electrical contact through said exposed part.

15. The vertical gate trench semiconductor device of claim 14, wherein
an additional electrode is formed on said gate in said recessed part with an insulating layer interposed, and
said additional electrode is in contact with said upper portion at the wall face of said recessed part.

16. A method of fabricating a vertical trench gate semiconductor device having a first portion functioning as a transistor and a second portion functioning as an electrical contact with a body region of said transistor and arranged adjacent to said first portion, comprising the steps of:
forming a first drain region in said first portion and a second drain region in said second portion and forming a first body region over said first drain region and a second body region over said second drain region;
forming a trench in said first body region and said second body region;
forming a first source region over said first body region; and
forming a second source region over said second body region,
wherein said first source region and said second source region are formed so as to be electrically connected to each other.

17. The method of claim 16, wherein
said fourth step includes introducing simultaneously an impurity to parts respectively to be said first source region and said second source region in said first portion.

18. The method of claim 16, wherein
said second source region is formed so as to cover an entirety of said second body region.

19. The method of claim 16, further comprising the step of:
forming a heavily doped region in an upper portion of said second body region
wherein an impurity concentration of said upper portion is higher than an impurity concentration of a lower portion of said second body region.

20. The method of claim 16, wherein
said second step includes forming said trench also through said second body region, and
said method further comprising, after said second step, the steps of:
forming a gate in said trench so as to form a recessed part in an upper part of said trench and so as to expose said second body region at a wall face of said recessed part; and
forming, in said recessed part, an additional electrode electrically connected with said second body region.

21. The method of claim 16, wherein
said method further comprising, after said second step and said fourth step, the steps of:
forming a gate in said trench so as to form a recessed part in an upper part of each said trench and so as to expose said second source region at a wall face of said recessed part; and
forming, in said recessed part, an additional electrode electrically connected with said second source region.

22. The method of claim 16, wherein
said method further comprising, after said second step and said fourth step, the steps of:
forming a gate electrode in said trench so as to form a recessed part in an upper part of said trench and so as to expose said second body region and said second source region at a wall face of said recessed part; and
forming, in said recessed part, an additional electrode electrically connected with said second body region and said second source region.

23. A method of fabricating a vertical trench gate semiconductor device having a first portion functioning as a transistor and a second portion functioning as electrical contact with a body region of said transistor and arranged adjacent to said first portion comprising the steps of:
forming a first drain region in said first portion and forming a second drain region in said second portion and forming a first body region over said first drain region and forming a second body region over said second drain region;
forming a trench in each said first body region and second body region;
forming a gate electrode in said trench so as to form a recessed part in an upper part of said trench and so as to expose said second body region at a wall face of said recessed part; and
forming, in said recessed part, an additional electrode electrically connected with the second body region.

24. The method of claim 23, further comprising the step of:
forming a heavily doped region in an upper portion of said second body region
wherein an impurity concentration of said upper portion is higher than an impurity concentration of a lower portion of said second body region.

25. The method of claim 24, wherein
said upper portion is exposed at the wall face of said recessed part.

26. The vertical gate semiconductor device of claim 1, wherein
said trench has a width of 0.25 µm or less, and
said trench has an aspect ratio of 5 or more.

27. The vertical gate semiconductor device of claim 26, wherein
a number of said trenches is 1500 or more.

28. The vertical gate semiconductor device of claim 10, wherein
said trench has a width of 0.25 µm or less, and
said trench has an aspect ratio of 5 or more.

29. The vertical gate semiconductor device of claim 28, wherein
a number of said trenches is 1500 or more.

30. A vertical gate semiconductor device characterized by comprising:
a first semiconductor layer of a first conductivity type to be a drain region;

a second semiconductor layer of a second conductivity type which is formed on said first semiconductor layer and to be a body region;

a third semiconductor layer of the first conductivity type which is formed on said second semiconductor layer and to be a source region;

a trench formed through said second semiconductor layer and said third semiconductor layer;

a gate disposed in said trench; and an electrode formed on said third semiconductor layer, wherein a fourth semiconductor layer of the second conductivity type which does not reach the surface of said third semiconductor layer and is exposed at a wall face of said trench is formed at a part of said third semiconductor layer which is provided along a direction along which said gate extends, and said fourth semiconductor layer is electrically isolated from said gatee and is electrically connected to said electrode through an upper part of said trench.

31. A vertical gate semiconductor device comprising:

a first semiconductor layer of a first conductivity type as a drain region;

a second semiconductor layer of a second conductivity type which is formed on said first semiconductor layer as a body region;

a third semiconductor layer of the first conductivity type which is formed on said second semiconductor layer as a source region;

a trench formed through said second semiconductor layer and said third semiconductor layer;

a gate disposed in said trench;

an insulating film disposed on said gate in said trench; and an electrode formed on said third semiconductor layer and on said disposed insulating film, wherein a fourth semiconductor layer of the second conductivity type which does not reach the surface of said third semiconductor layer and is exposed at a wall face of said trench is formed at a part of said third semiconductor layer which is provided along a direction along which said gate extends, and said fourth semiconductor layer is electrically connected to said electrode through an upper part of said trench.

32. The vertical gate semiconductor device of claim 30, wherein said fourth semiconductor layer is periodically formed in said third semiconductor layer along a direction along which said trench extends.

33. The vertical gate semiconductor device of claim 31, wherein said fourth semiconductor layer is periodically formed in said third semiconductor layer along a direction along which said trench extends.

34. The vertical gate semiconductor device of claim 30, wherein said trench is formed in plural parts, a width of each said plural trenches is set to 0.25 µm or less, and intervals between said plural trenches are set to 0.25 µm or less.

35. The vertical gate semiconductor device of claim 34, wherein an aspect ratio of each said plural trenches is set to 5 or more.

36. The vertical gate semiconductor device of claim 31, wherein said trench is formed in plural parts, a width of each said plural trenches is set to 0.25 µm or less, and intervals between said plural trenches are set to 0.25 µm or less.

37. The vertical gate semiconductor device of claim 36, wherein an aspect ratio of each said plural trenches is set to 5 or more.

* * * * *